United States Patent
Suzuki

(10) Patent No.: US 7,884,652 B2
(45) Date of Patent: Feb. 8, 2011

(54) PULSE SIGNAL GENERATING DEVICE, TRANSPORT DEVICE, IMAGE FORMING APPARATUS, AND PULSE GENERATING METHOD

(75) Inventor: Toshiyuki Suzuki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 150 days.

(21) Appl. No.: 12/416,234

(22) Filed: Apr. 1, 2009

(65) Prior Publication Data

US 2009/0256615 A1    Oct. 15, 2009

(30) Foreign Application Priority Data

Apr. 10, 2008    (JP) .............................. 2008-102685

(51) Int. Cl.
*H03K 17/00* (2006.01)
*G06F 1/08* (2006.01)

(52) U.S. Cl. ...................................................... 327/99

(58) Field of Classification Search .................... 327/99
See application file for complete search history.

(56) References Cited

U.S. PATENT DOCUMENTS 7,671,634 B2 *   3/2010   McCoy ........................ 327/99

FOREIGN PATENT DOCUMENTS

| JP | 11-245383 | 9/1999 |
| JP | 2005-091943 | 4/2005 |
| JP | 2005-350195 | 12/2005 |

* cited by examiner

*Primary Examiner*—Lincoln Donovan
*Assistant Examiner*—Daniel Rojas
(74) *Attorney, Agent, or Firm*—Workman Nydegger

(57) ABSTRACT

A pulse signal generating device includes: the plurality of encoders each of which outputs an encoder signal with a pulse period corresponding to the speed of an object to be detected; delay amount control unit that controls a relative delay amount with respect to a pulse signal for each of the plurality of pulse output signals output from the plurality of encoders; a detection unit that individually detects abnormalities in pulses of the plurality of encoder signals; a switching unit that performs switching to one pulse output signal, in which pulse abnormalities are not detected, of the plurality of pulse output signals; and a pulse generating unit that generates a pulse signal by delaying the one pulse output signal switched by the switching unit by the corresponding relative delay amount.

9 Claims, 12 Drawing Sheets

MASK PROCESSING

DELAY PROCESSING

FIG. 12A
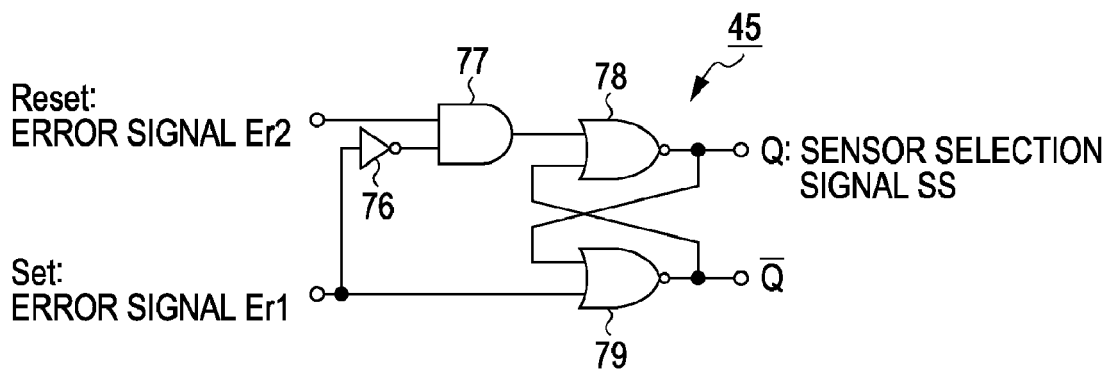
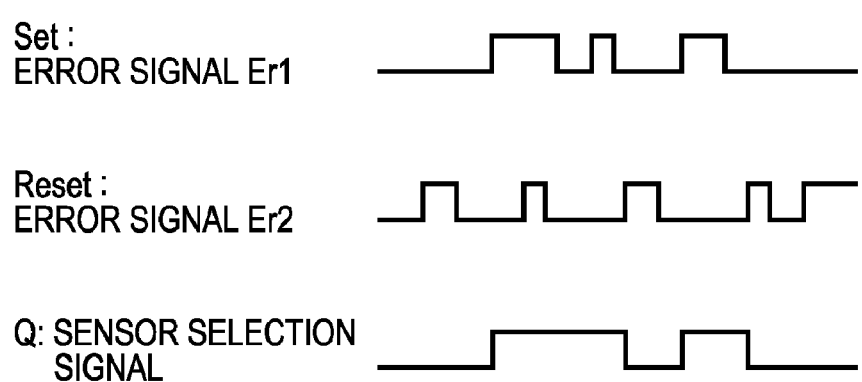
FIG. 12B

PULSE SIGNAL GENERATING DEVICE, TRANSPORT DEVICE, IMAGE FORMING APPARATUS, AND PULSE GENERATING METHOD

BACKGROUND

1. Technical Field

The present invention relates to a pulse signal generating device that generates a pulse with a restored period by detecting period abnormalities in an output pulse of an encoder, a transport device, an image forming apparatus, and a pulse signal generating method.

2. Related Art

A known image forming apparatus, such as a printer, has a configuration in which a recording head performs printing on paper (target) transported in a transport direction. In this case, it is necessary to discharge ink droplets at proper timing according to the paper transport position. For this reason, a print reference signal is generated in synchronization with the transport speed of paper on the basis of an output signal (pulse signal), which is output from an encoder in synchronization with the paper transport speed, and the discharge timing is controlled on the basis of the print reference signal.

For example, JP-A-11-245383 discloses a printer (image forming apparatus) that uses a transport belt as a paper transport unit. A mark for detecting the speed and position is set on the transport belt, and a character or an image is printed on the paper by reading the mark with an encoder and discharging ink on the basis of the encoder signal.

As disclosed in JP-A-11-245383, in a printer using a paper transport unit such as a transport belt, ink droplets are discharged for every desired pitch by detecting the amount of movement of recording paper from the amount of movement of a belt in a condition where the amount of movement of recording paper is assumed to be equal to the amount of movement of the belt. Since discharge of ink droplets is performed in synchronization with an encoder signal having pulses with the same distance as a print pitch, high-quality printing capable of suppressing the positional deviation of landing ink droplets becomes possible even if there is a speed variation in the transport unit. However, since encoder signals need to be output continuously at the same pitch in the method disclosed in JP-A-11-245383, the following problems occur.

If the circumferential length of the recording paper transport unit (transport belt) is not integral multiples of the print pitch, a discontinuous portion occurs in an output signal of a linear encoder, which causes image deterioration. Moreover, when ink mist or paper particles adhere to the linear encoder disposed on the transport belt or the linear encoder is damaged, lack of a pulse occurs in the encoder signal. Also in this case, image deterioration occurs.

A device for solving such a problem is disclosed in JP-A-2005-91943 and JP-A-2005-350195 (for example, paragraphs [0041] to [0053] in the specification and FIGS. 6 to 11), for example. JP-A-2005-91943 discloses a device that uses two sensors while switching the sensors at the home sensor position. A phase difference between signals at the time of sensor switching is detected by pre-driving.

JP-A-2005-350195 discloses a configuration where two sensors for detecting a mark are provided such that positions of objects to be detected are different and an output signal, which is used for motor control for controlling the transport speed of a belt constantly, is switched to an output signal of the other sensor when a discontinuous portion of a mark, such as a joint of the transport belt, or lack of a pulse caused by dust or damage is detected on the basis of an output signal of one sensor. Moreover, in order to suppress the phase difference between signals at the time of sensor switching, a configuration where an interpolation processing portion generates a high-resolution signal by dividing a measured period or using the same clock so that a signal error (phase difference) is reduced is adopted. Moreover, JP-A-2005-91943 and JP-A-2005-350195 disclose a method of counting a period of a sensor signal (encoder signal) with a base clock and determining that there is a discontinuous portion (lack of a pulse of an encoder signal) of a mark when the pulse period of the sensor signal reaches a fixed threshold value or more.

However, the technique disclosed in JP-A-2005-91943 is effective only in a place set beforehand as a joint, and joint position detection using a home sensor is needed. In addition, there was a problem that it was not possible to cope with sudden missing.

Furthermore, according to the device disclosed in JP-A-2005-350195, a phase difference frequently occurs due to phase matching using period division. In addition, there is also a problem that pulse missing detection is delayed. For this reason, since a pulse period become long in a portion where missing occurs, a period from an interpolation pulse to the next normal pulse output becomes short. In order to prevent this, if a threshold value is set small, there was a possibility of erroneous detection of pulse missing even when the normal pulse generation time was overdue due to speed variation.

SUMMARY

An advantage of some aspects of the invention is that it provides a pulse signal generating device, a transport device, an image forming apparatus, and a pulse signal generating method capable of effectively suppressing a variation in a period of a pulse signal, which is caused by the phase shift at the time of switching of a pulse output signal, small even if pulse period abnormalities occur in an encoder signal.

According to an aspect of the invention, a pulse signal generating device that generates a pulse signal on the basis of one switched pulse output signal of a plurality of pulse output signals output from a plurality of encoders includes: the plurality of encoders each of which outputs an encoder signal with a pulse period corresponding to the speed of an object to be detected; a delay amount control unit that controls a relative delay amount with respect to a pulse signal for each of the plurality of pulse output signals output from the plurality of encoders; a detection unit that individually detects abnormalities in pulses of the plurality of encoder signals; a switching unit that performs switching to one pulse output signal, in which pulse abnormalities are not detected, of the plurality of pulse output signals; and a pulse generating unit that generates a pulse signal by delaying the one pulse output signal switched by the switching unit by the corresponding relative delay amount.

According to the aspect of the invention, the relative delay amount of each of the plurality of pulse output signals output from the plurality of encoders with respect to a pulse signal is controlled by the delay amount control unit. The abnormalities in pulses of the plurality of encoder signals are individually detected by the detection unit. The switching unit performs switching to one pulse output signal, in which pulse abnormalities are not detected, of the plurality of pulse output signals. In addition, the pulse generating unit generates a pulse signal by delaying one pulse output signal switched by the switching unit by the corresponding relative delay amount. Therefore, even in case where the pulse period abnormalities occur in the encoder signal, a variation in a period of a pulse signal caused by the phase shift at the time of switching of a pulse output signal can be effectively suppressed small.

Furthermore, in the pulse signal generating device according to the aspect of the invention, it is preferable to further include an output signal generating unit that generates the pulse output signal by making an adjustment such that a pulse period falls within a limit range on the basis of the encoder signal.

According to the aspect of the invention, the output signal generating unit generates the pulse output signal by adjusting an abnormal pulse period such that all pulse periods fall within the limit range on the basis of the encoder signal. That is, an adjustment is made on the basis of the encoder signal such that the pulse period falls within the limit range when the period abnormalities occur, and a pulse output signal is generated by using the encoder signal as it is in the case of a normal period. Accordingly, a pulse period of a pulse signal can be made to fall within the appropriate range.

In the pulse signal generating device according to the aspect of the invention, the detection unit is preferably configured to detect at least period upper limit abnormalities, in which a period exceeds an upper limit of a normal period, as the pulse abnormalities. In addition, preferably, the output signal generating unit generates the pulse output signal based on an encoder pulse with the normal period by delaying an encoder pulse with a normal period, in which a pulse period falls within the limit range, among the encoder signals by a predetermined delay time allowing a pulse period between a pulse of a pulse output signal after switching and a pulse of a pulse output signal before switching to fall within the limit range when the switching unit switches the pulse output signal on the basis of detection of period upper limit abnormalities of the detection unit.

According to this configuration, in case of generating a pulse output signal on the basis of an encoder pulse with a normal period among encoder signals, the output signal generating unit generates a pulse output signal by delaying the encoder pulse with a normal period by the predetermined delay time. The predetermined delay time is set to a value allowing a pulse period between a pulse of a pulse output signal after switching and a pulse of a pulse output signal before switching to fall within the limit range when the switching unit switches the pulse output signal on the basis of detection of period upper limit abnormalities of the detection unit. As a result, a pulse period between a pulse of a pulse output signal after switching and a pulse of a pulse output signal before switching can be made to fall within the limit range when the switching unit switches the pulse output signal on the basis of detection of period upper limit abnormalities of the detection unit.

In the pulse signal generating device according to the aspect of the invention, it is preferable to further include a reasonable period acquisition unit that measures a pulse period of the pulse signal and calculates a reasonable period on the basis of a plurality of period measurement results. The pulse generating unit preferably generates a pulse signal such that a pulse with the same period as the reasonable period is connected to one-previous pulse of the pulse signal when the detection unit detects the period abnormalities in all of the plurality of encoders.

According to the aspect of the invention, the reasonable period acquisition unit calculates a reasonable period on the basis of a plurality of period measurement results of a period measuring unit that measures a pulse period of a pulse signal. When the detection unit detects the period abnormalities in all of the plurality of encoders, the pulse generating unit generates a pulse signal by connecting a pulse with the same period as the reasonable period to one-previous pulse of the pulse signal. Therefore, even in case where the period abnormalities are detected in all of the plurality of encoders, a pulse of a pulse signal can be generated with an appropriate pulse period.

Furthermore, in the pulse signal generating device according to the aspect of the invention, it is preferable that the delay amount control unit include phase difference measuring units, which measure a phase difference, provided for every pulse output signals. In addition, preferably, the relative delay amount is an adjustment time corresponding to the phase difference.

According to the aspect of the invention, the phase difference is measured for every pulse output signal by the phase difference measuring unit. The pulse generating unit generates a pulse signal by delaying the pulse output signal by an adjustment time corresponding to the phase difference. As a result, the phase shift of a pulse signal at the time of switching of a pulse output signal can be prevented effectively.

In the pulse signal generating device according to the aspect of the invention, preferably, the phase difference measuring unit corresponding to one pulse output signal switched by the switching unit stops measurement of a phase difference and holds a phase difference at the time of switching, and the phase difference measuring units corresponding to the other pulse output signals perform measurement of a phase difference. In addition, it is preferable that the pulse generating unit delay the switched pulse output signal by an adjustment time corresponding to the held phase difference.

According to the aspect of the invention, the phase difference measuring unit corresponding to one pulse output signal switched by the switching unit stops measurement of a phase difference and holds a phase difference at the time of switching. On the other hand, the phase difference measuring units corresponding to the other pulse output signals perform measurement of a phase difference. The pulse generating unit generates a pulse signal by delaying the switched pulse output signal by the adjustment time corresponding to the held phase difference. Accordingly, a pulse period of a pulse output signal can be held even if a pulse output signal is delayed. In addition, by delaying a pulse output signal of a switching destination at an appropriate adjustment time at the time of next switching, period abnormalities in the pulse signal caused by the phase shift of pulse output signals before and after switching can be suppressed effectively.

According to another aspect of the invention, a transport device includes the pulse signal generating device described above; and a transport unit as the object to be detected. The encoder included in the pulse signal generating device outputs an encoder signal with a pulse period corresponding to the transport speed of the transport unit.

According to the aspect of the invention, it is possible to provide a transport device capable of generating a pulse signal, which has a period corresponding to the transport speed of the transport unit, in a state where there are almost no period abnormalities.

According to still another aspect of the invention, an image forming apparatus includes: the transport device described above; a recording unit that performs recording to form an image on a target transported by the transport unit; and a control unit that controls recording timing of the recording unit on the basis of the pulse signal generated by the pulse generating unit.

According to the aspect of the invention, since the control unit controls the recording timing of the recording unit on the basis of a pulse signal, an image with good quality can be recorded on a target.

According to still another aspect of the invention, a pulse signal generating method of generating a pulse signal on the basis of one switched pulse output signal of a plurality of pulse output signals output from a plurality of encoders includes: controlling a relative delay amount with respect to a pulse signal for each of the plurality of pulse output signals output from the plurality of encoders; individually detecting abnormalities in pulses of the plurality of encoder signals; performing switching to one pulse output signal, in which pulse abnormalities are not detected, of the plurality of pulse output signals; and generating a pulse signal by delaying the one pulse output signal switched in the switching by the corresponding relative delay amount. According to the aspect of the invention, the same effects as in the pulse signal generating device can be obtained.

BRIEF DESCRIPTION OF THE DRAWINGS

The invention will be described with reference to the accompanying drawings, wherein like numbers reference like elements.

FIG. 12A is a circuit diagram of a sensor selection circuit, and FIG. 12B is a timing chart illustrating an operation of the sensor selection circuit.

DESCRIPTION OF EXEMPLARY EMBODIMENTS

Hereinafter, a first embodiment of the invention will be described with reference to FIGS. 1 to 14.

Figure 1:
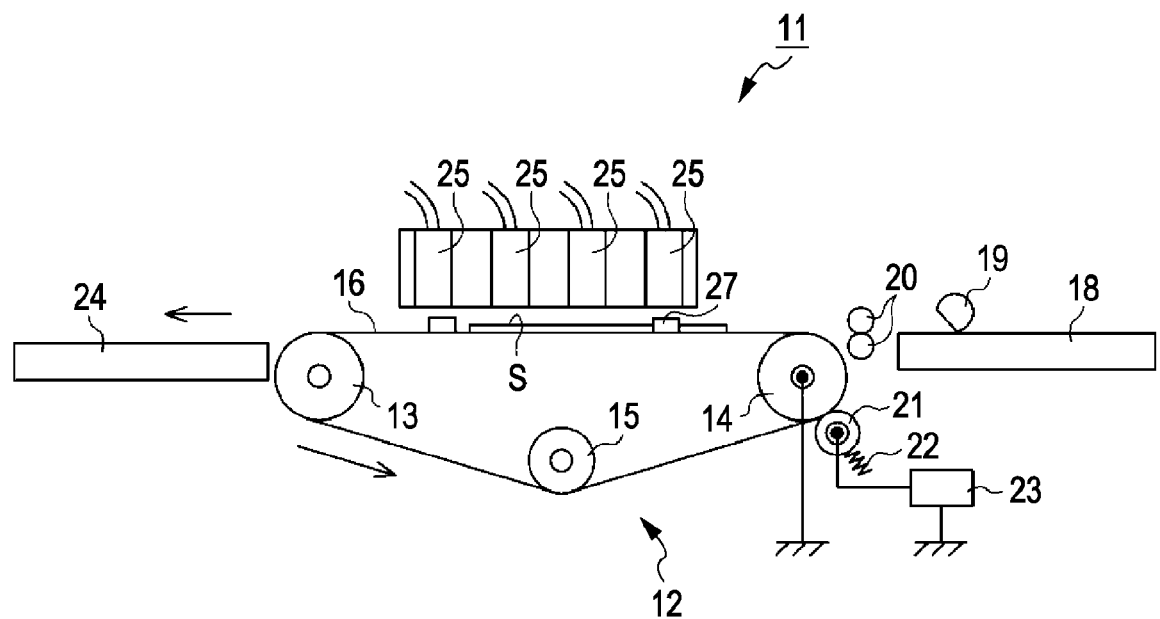
FIG. 1 is a side view schematically illustrating the configuration of a printer in an embodiment.
Figure 2:
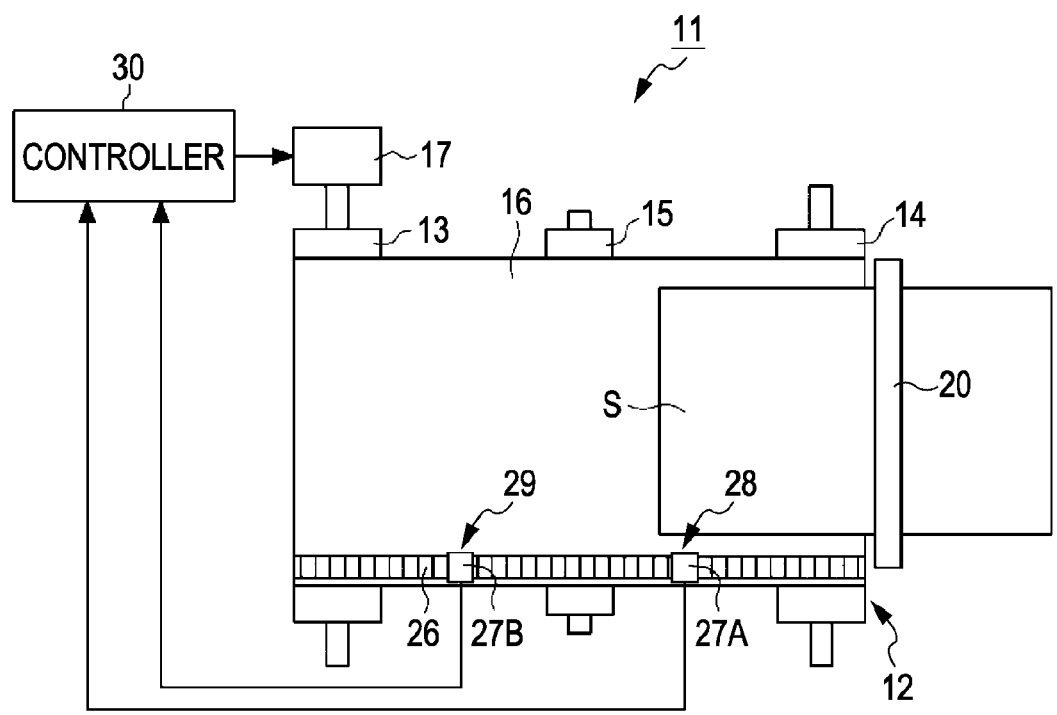
FIG. 2 is a plan view schematically illustrating the printer in a state where a recording head is omitted.

FIG. 1 is a side view schematically illustrating an ink jet recording apparatus, and FIG. 2 is a plan view schematically illustrating the ink jet recording apparatus. In addition, a recording head and the like are omitted in FIG. 2.

As shown in FIGS. 1 and 2, an ink jet recording apparatus (hereinafter, simply referred to as a printer 11) as an image forming apparatus includes a belt transport device 12 as a transport unit that transports recording paper S. The belt transport device 12 has a driving roller 13 provided at a downstream side in the paper transport direction (left side in FIGS. 1 and 2), a driven roller 14 provided at an upstream side in the paper transport direction, a tension roller 15 disposed at the approximately middle position between the driving roller 13 and the driven roller 14 and at a slightly lower side (refer to FIG. 2), and an endless transport belt 16 wound around the rollers 13 to 15.

As shown in FIG. 2, an output shaft of an electric motor 17 is connected to the driving roller 13 so that the power can be transmitted directly or through a deceleration mechanism (not shown). When the electric motor 17 is driven to normally rotate, the driving roller 13 is driven to rotate such that the transport belt 16 rotates in a direction in which the recording paper S can be transported from the upstream side to the downstream side.

A paper feed portion 18 is provided at the upstream side of the belt transport device 12, and the recording paper S loaded on the paper feed portion 18 is fed one at a time by a paper feed roller 19. A gate roller 20 is provided between the paper feed portion 18 and the belt transport device 12, and the recording paper S is fed onto the transport belt 16 by rotation of the gate roller 20. In addition, the gate roller 20 corrects the skew of the recording paper S by bringing the recording paper S into contact with a roller surface, and matches timing such that the recording paper S is placed on the target position on the transport belt 16 by determining the driving start timing of the gate roller 20 and then sends the recording paper S.

Below the driven roller 14, a charging roller 21 is disposed to be biased toward the driven roller 14 by a spring 22 so that the charging roller 21 can rotate in a state of being in contact with the transport belt 16. Since the charging roller 21 is connected to a power source 23, the charging roller 21 can make the transport belt 16 electrically charged. Then, the recording paper S electrostatically sticks to the transport belt 16. In addition, a method for sticking of the recording paper S onto the belt is not limited to the electrostatic sticking method. For example, a negative pressure sticking method of sticking the recording paper S by generating the suction air flow with the negative pressure from a suction hole formed on the transport belt 16 may be adopted. In addition, a paper discharge portion 24 as a discharge place of the recording paper S after printing on the transport belt 16 is provided at the downstream side of the belt transport device 12.

Above the middle position of the transport belt 16 in the transport direction thereof, a plurality of line-head-type long recording heads 25 are disposed along the transport direction in a direction in which the width direction of the transport belt 16 and the longitudinal direction of each of the recording heads 25 are parallel. In the recording head 25, a plurality of nozzle rows, in which a plurality of nozzles are arrayed at fixed nozzle pitches over a range slightly wider than an entire region of the recording paper S in the width direction that has a maximum width over which the printer 11 can perform printing, are provided on a bottom surface (nozzle formed surface). Accordingly, an image and the like can be printed on the recording paper S being transported by ejecting ink droplets from the nozzles sequentially at timing matched with the paper transport speed. In this example, each recording head 25 is connected with an ink cartridge (not shown) through an ink supply tube, and ink supplied from the corresponding ink cartridge is discharged. In this example, the recording heads 25 eject ink droplets corresponding to four colors of black, cyan, magenta, and yellow in order from the upstream side (right side in FIG. 1).

As shown in FIG. 2, in the side edge of the upper surface of the transport belt 16, a magnetic linear scale 26 is provided in the entire edge of the transport belt 16 along the transport direction. The magnetic linear scale 26 is formed by recording a magnetic pattern on a belt-like magnetic recording layer, which is formed in the side edge of the transport belt 16, at fixed pitches. A first encoder sensor 27A and a second encoder sensor 27B, which are formed by using magnetic sensors for reproducing a magnetic pattern recorded on the magnetic linear scale 26, are provided at positions near the upper side (front side of the plane of the drawing in FIG. 2) of the magnetic linear scale 26. Two linear encoders 28 and 29 are formed by the magnetic linear scale 26 and the two encoder sensors 27A and 27B that share the magnetic linear scale 26 as a detected body. In addition, a controller 30 as a control unit is provided in the printer 11. The controller 30 controls driving of the electric motor 17 (shown in FIG. 2) and controls ejection of ink droplets at proper timing matched with the paper transport speed (paper transport position) based on the print reference signal PTS (ejection timing signal; refer to FIG. 14) which is generated on the basis of encoder signals ES1 and ES2 (encoder pulses) input from the encoder sensors 27A and 27B in an internal circuit.

Figure 3:
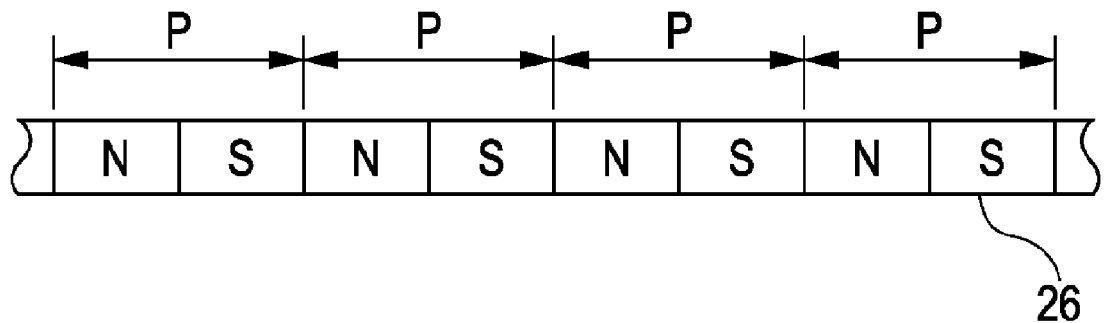
FIG. 3 is a plan view schematically illustrating a magnetic linear scale.

FIG. 3 is a schematic view illustrating a part of a magnetic pattern of a magnetic linear scale. As shown in FIG. 3, on the magnetic linear scale 26, a magnetic pattern in which N poles and S poles are alternately magnetized in a regular manner at fixed pitches (magnetic pitch P) is formed to detect the position of the transport belt 16 (the same for the recording paper S). The magnetic pitch P that is an arrangement period of detected elements (poles N and S) of the magnetic linear scale 26 is set from the belt transport speed and the print resolution at the time of printing of the printer 11. For example, the magnetic pitch P is a value of about 35 μm (in the case of resolution of 720 dpi) or 70 μm (in the case of resolution of 360 dpi).

Figure 4:
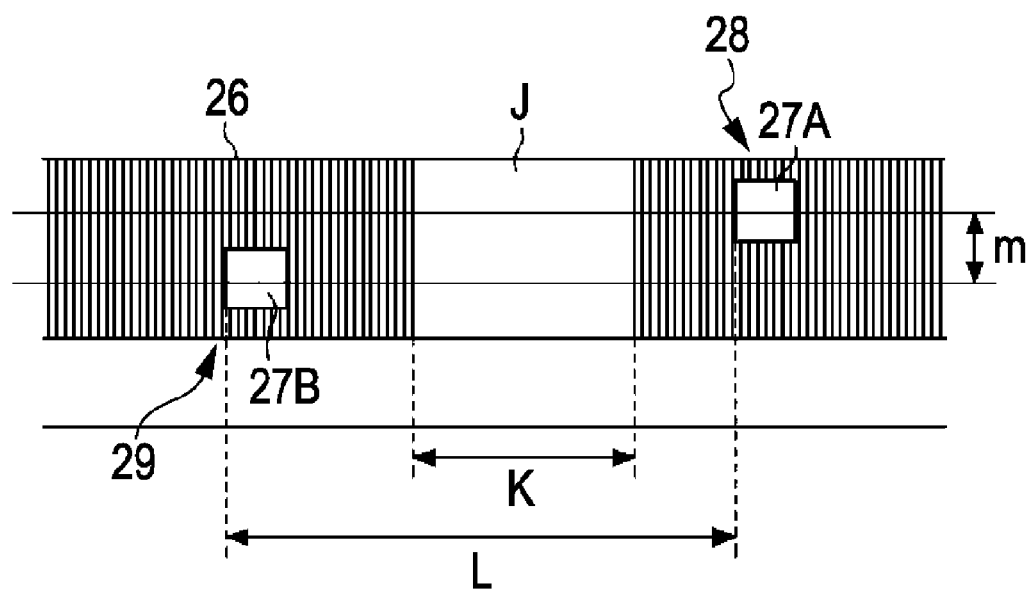
FIG. 4 is a plan view schematically illustrating a part of a linear encoder.

The arrangement configuration of encoder sensors is shown in FIG. 4. The two encoder sensors 27A and 27B that form the two linear encoders 28 and 29 are disposed spaced apart from each other by 'L' in the transport direction and 'm' in the belt width direction. Since the transport belt 16 is formed by bonding both ends of a sheet of belt-like rubber, which has a predetermined length, to each other, the transport belt 16 has a joint J. Assuming that the length of the joint J of the transport belt 16 in the transport direction is 'K', the two encoder sensors 27A and 27B are disposed such that the relationship of L>K is satisfied. As a result, the two encoder sensors 27A and 27B are disposed such that the joint J does not hang on both the encoder sensors 27A and 27B at the same time. Moreover, when contact type sensors are used as the encoder sensors 27A and 27B, it is prevented that the same place in the belt width direction is intensively slid by disposing the encoder sensors 27A and 27B to be spaced apart from each other by 'm'. As a result, it becomes possible to improve the belt durability. In addition, positions at which the encoder sensors 27A and 27B do not deviate from the scale width of the magnetic linear scale 26 even if the transport belt 16 moves in a meandering or oblique manner are set as the arrangement positions of the encoder sensors 27A and 27B in the belt width direction. In addition, 'm' indicates a center-to-center distance between detection portions of both the encoder sensors 27A and 27B.

Figure 5:
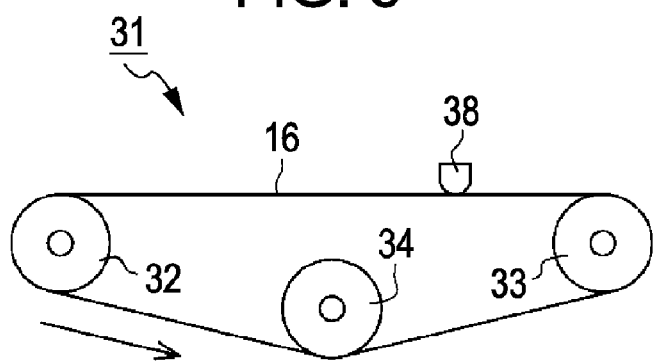
FIG. 5 is a side view schematically illustrating a magnetizer.
Figure 6:
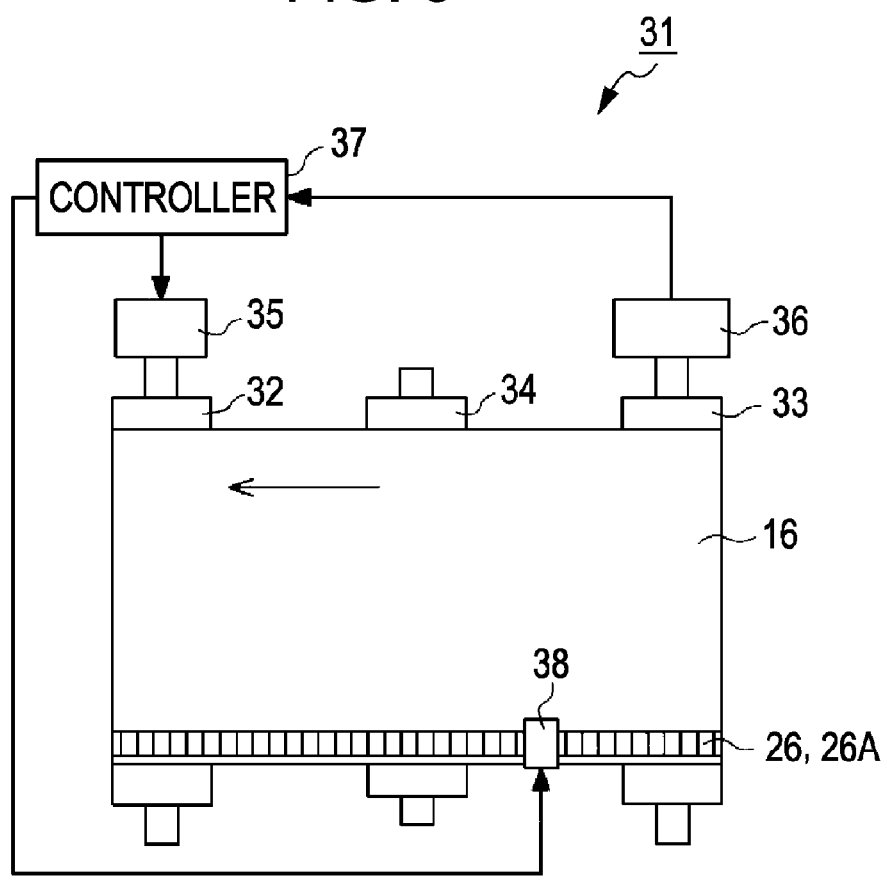
FIG. 6 is a plan view schematically illustrating the magnetizer.

FIGS. 5 and 6 are schematic views illustrating a magnetizer of a magnetic linear scale. FIG. 5 is a side view schematically illustrating the magnetizer, and FIG. 6 is a plan view schematically illustrating the magnetizer.

A magnetizer 31 includes a driving roller 32, a driven roller 33, and a tension roller 34 having almost the same configuration as those of the belt transport device 12 of the printer 11. In the transport belt 16, a magnetic layer 26A with a predetermined width is formed in the side edge not included in the paper transport path using a technique, such as coating. The transport belt 16 is mounted to be wound around the rollers 32 to 34.

As shown in FIG. 6, an electric motor 35 (for example, a DC motor) is connected to the driving roller 32 so that the power can be transmitted directly or through a deceleration mechanism. In addition, a rotary encoder 36 with high resolution (for example, 7,200,000 pulses/rev) is attached to the driven roller 33. An encoder pulse synchronized with the rotation angle from the rotary encoder 36 is input to a controller 37, and the controller 37 controls driving of the electric motor 35 such that the transport belt 16 is driven to rotate at precisely constant speed on the basis of the encoder pulse.

In the magnetizer 31, a writing magnetic head 38 shown in FIG. 5 is provided at a position of the transport belt 16 corresponding to the magnetic layer 26A in a state of being in light contact with the magnetic layer 26A. In addition, for example, a magnetic sensor that can output multiple values, such as a GMR (giant magneto resistive effect) sensor and an MR (magneto resistive effect) sensor, is used as the writing magnetic head 38. In addition, a hall device, an MI (magnetic impedance) element, and the like may also be used.

The writing magnetic head 38 is connected to a writing control circuit (not shown) within the controller 37. The writing control circuit writes a magnetic pattern, in which the poles N and S are alternately magnetized at the fixed magnetic pitch P, in the magnetic layer 26A by changing the current direction of a coil in the writing magnetic head 38 using a frequency-divided signal which is obtained, for example, by dividing an encoder pulse from the rotary encoder 36. Thus, the transport belt 16 having the magnetic linear scale 26, on which a predetermined magnetic pattern is written, at the side end is wound around the rollers 13 to 15 of the printer 11.

In addition, when there are shape defects, such as a level difference, in the joint J of the transport belt 16 or paper particles or ink mist adheres to the magnetic linear scale 26, lack (pulse missing) of output pulses of the encoder sensors 27A and 27B that form the linear encoders 28 and 29 occurs. In addition, since a middle value (average belt speed) in the speed distribution of the transport belt 16 changes with an individual difference of the printer 11, a middle value (average pulse period) in the period distribution of pulses output from the linear encoders 28 and 29 changes for every printer 11. Moreover, variations in eccentric amount, belt thickness, and the like of the rollers 13 and 14 generate a variation in speed of the transport belt 16. This causes variations in periods of output pulses of the linear encoders 28 and 29.

Figure 7:
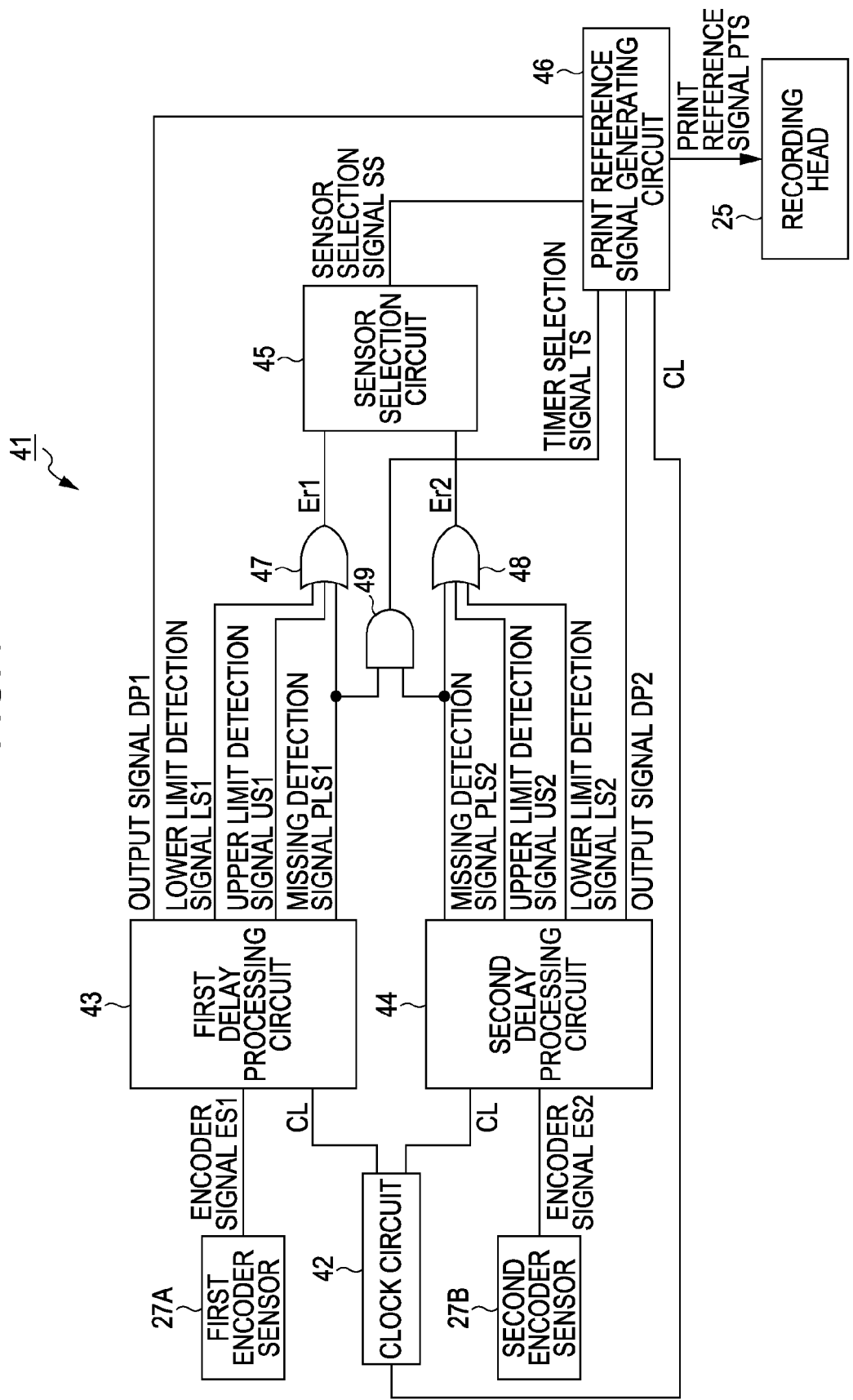
FIG. 7 is a circuit diagram illustrating the electrical configuration of a print reference signal generating device.
Figure 8:
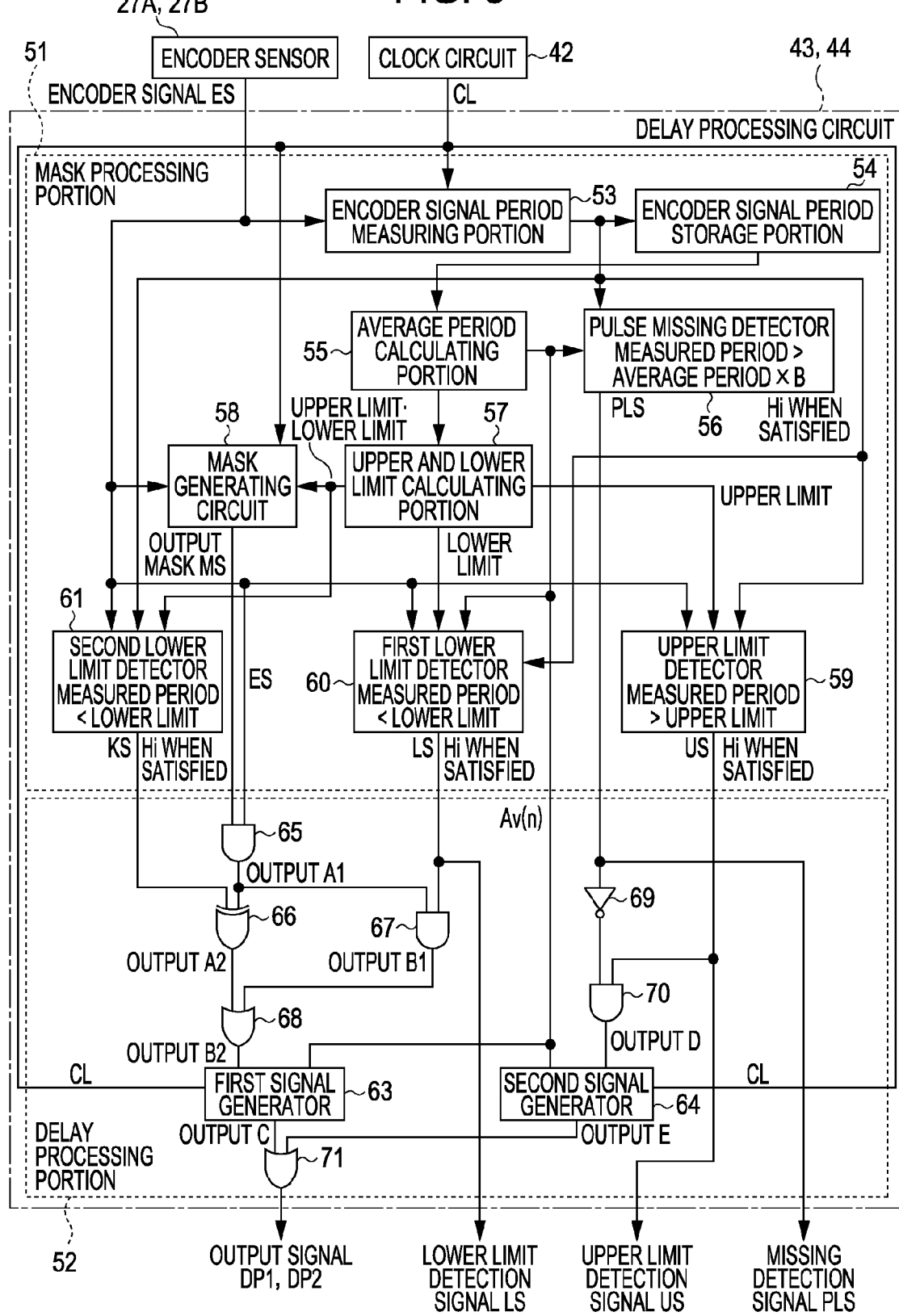
FIG. 8 is a circuit diagram illustrating the electrical configuration of a delay processing circuit.
Figure 9A:
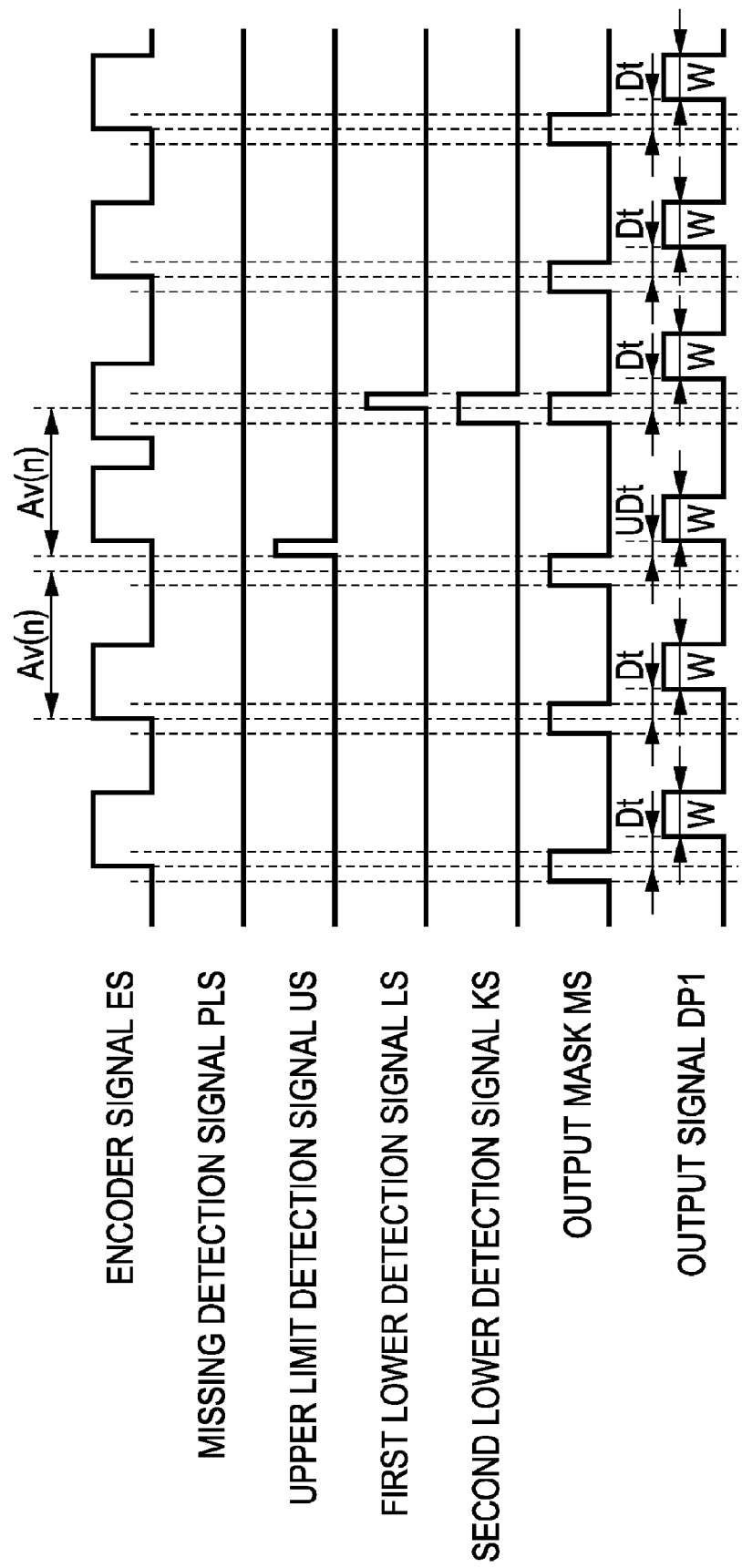
FIG. 9A is a signal timing chart in mask processing.
Figure 9B:
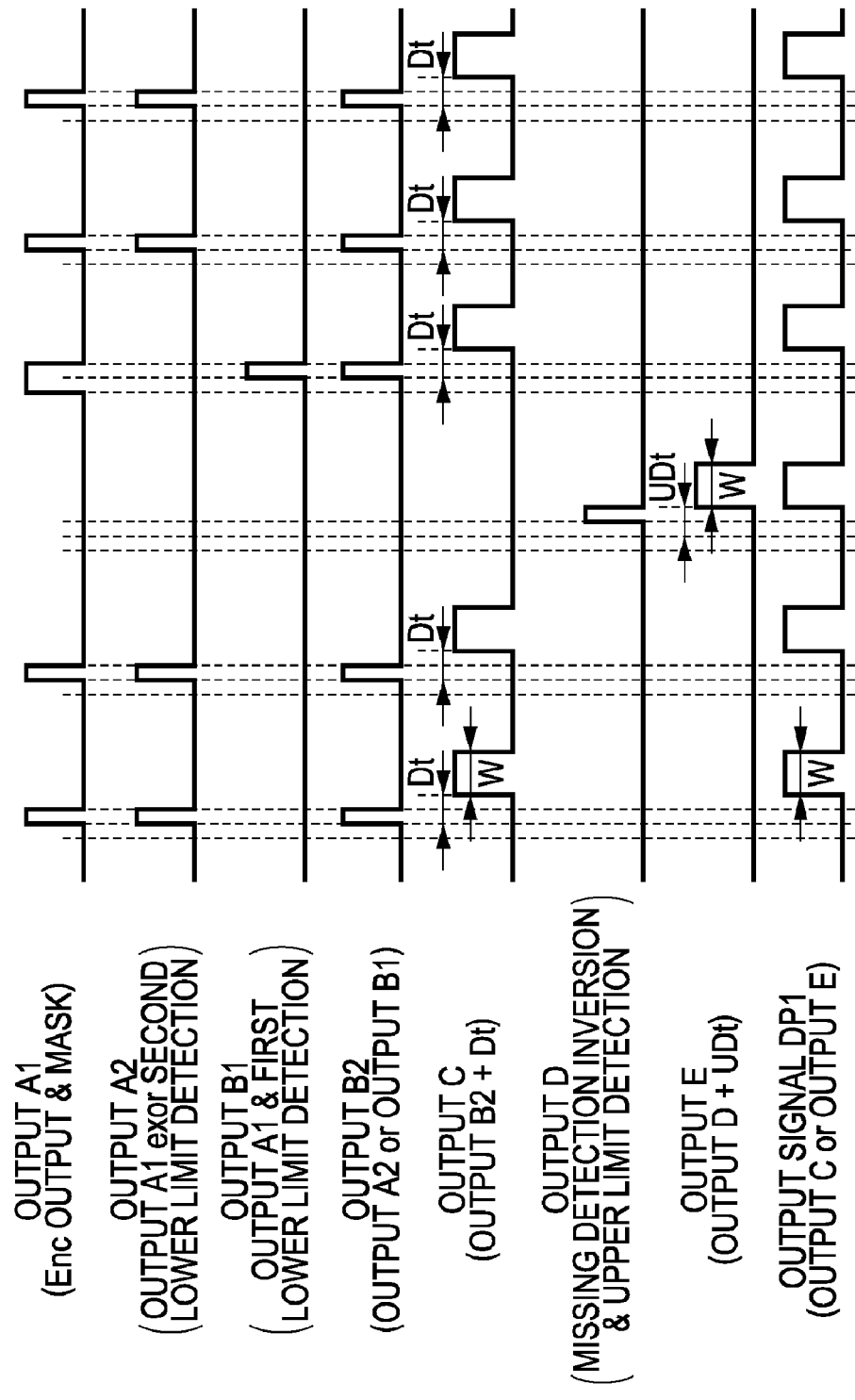
FIG. 9B is a signal timing chart in delay processing.

FIG. 7 shows a print reference signal generating device provided in the controller 30. FIG. 8 shows a delay processing circuit. In addition, FIGS. 9A and 9B show signal timing charts in a delay processing circuit. FIG. 9A shows mask processing and FIG. 9B shows delay processing. Hereinafter, the configuration and operation of the print reference signal generating device will be described according to FIG. 7 while referring to FIGS. 8, 9A, and 9B as needed. A print reference signal generating device 41 as a pulse signal generating device generates the print reference signal PTS on the basis of an encoder signal ES from the linear encoders 28 and 29 and a reference clock signal CL from a clock circuit 42 and outputs the print reference signal PTS to the recording head 25. Moreover, in the recording head 25, a discharge driving element (not shown) in which a head driving circuit is provided for every nozzle is driven according to the timing of the print reference signal PTS on the basis of print data, such that an ink droplet is ejected from a nozzle corresponding to the driven discharge driving element. Here, for example, an electrostatic driving element, a heater, and a piezoelectric vibration element used in an ink jet system may be adopted as the discharge driving element.

As shown in FIG. 7, the print reference signal generating device 41 includes the first encoder sensor 27A, the second encoder sensor 27B, the clock circuit 42, a first delay processing circuit 43, a second delay processing circuit 44, a sensor selection circuit 45, and a print reference signal generating circuit 46.

The first delay processing circuit 43 is input with an encoder signal ES1 from the first encoder sensor 27A and the reference clock signal CL from the clock circuit 42 and performs pulse period abnormality detection processing and pulse period correction processing on the encoder signal ES1. The first delay processing circuit 43 performs pulse missing detection processing for detecting pulse missing of the encoder signal ES, upper limit detection processing for determining whether or not a pulse period exceeds the upper limit of an appropriate period range, and lower limit detection processing for detecting whether or not the pulse period has been less than the lower limit of the appropriate period range as the pulse period abnormality detection processing. Then, the first delay processing circuit 43 outputs a missing detection signal PLS1, an upper limit detection signal US1, and a lower limit detection signal LS1 each of which has a Hi level at the time of abnormality detection and a Low level at the time of normal detection. In addition, the first delay processing circuit 43 generates an output signal DP1, which has a pulse with the same period as the print reference signal PTS output from the print reference signal generating circuit 46 and becomes a reference pulse when generating the print reference signal PTS, on the basis of the encoder signal ES1 and the like.

In addition, the second delay processing circuit 44 has the same circuit configuration as the first delay processing circuit 43. The second delay processing circuit 44 is input with an encoder signal ES2 from the second encoder sensor 27B and the reference clock signal CL and performs pulse period abnormality detection processing and pulse period correction processing on the encoder signal ES2 in the same manner as the first delay processing circuit 43. In addition, as a detection result of the pulse period abnormality detection processing in the internal circuit, the second delay processing circuit 44 outputs a missing detection signal PLS2, an upper limit detection signal US2, and a lower limit detection signal LS2 and outputs an output signal DP2 which has the same period as the print reference signal PTS and becomes a reference pulse when generating the signal.

Three signals of the missing detection signal PLS1, the upper limit detection signal US1, and the lower limit detection signal LS1 output from the first delay processing circuit 43 are input to an OR circuit 47, and the OR operation result is output as an error signal Er1 from the OR circuit 47. Accordingly, if at least one detection signal of the three signals of the missing detection signal PLS1, the upper limit detection signal US1, and the lower limit detection signal LS1 has a Hi level at the time of period abnormality detection, the error signal Er1 has a Hi level. If all of the three signals have Low levels at the time of normal detection, the error signal Er1 has a Low level. Similarly, three signals of the missing detection signal PLS2, the upper limit detection signal US2, and the lower limit detection signal LS2 output from the second delay processing circuit 44 are input to an OR circuit 48, and the OR operation result is output as an error signal Er2 from the OR circuit 48. The error signals Er1 and Er2 from the OR circuits 47 and 48 are input to the sensor selection circuit 45.

When one of the input error signals Er1 and Er2 has a Hi level indicating period abnormality detection, the sensor selection circuit 45 outputs a sensor selection signal indicating that an output signal is selected from a delay processing circuit opposite a delay processing circuit on a side where the error signal Er having the Hi level is input. In the present embodiment, the sensor selection circuit 45 outputs a sensor selection signal SS with a Low level when the error signal Er1 has a Hi level and outputs the sensor selection signal SS with a Hi level when the error signal Er2 has a Hi level. The sensor selection signal SS output from the sensor selection circuit 45 is input to the print reference signal generating circuit 46.

In addition, the missing detection signal PLS1 of the first delay processing circuit 43 and the missing detection signal PLS2 of the second delay processing circuit 44 are input to an AND circuit 49, and the AND operation result is output as a timer selection signal TS from the AND circuit 49. That is, the timer selection signal TS has a Hi level when pulse missing is simultaneously detected in the encoder signals ES1 and ES2 and has a Low level in other cases. The timer selection signal TS is input to the print reference signal generating circuit 46. In addition, the output signals DP1 and DP2 from the first and second delay processing circuits 43 and 44 are input to the print reference signal generating circuit 46.

In a condition where the timer selection signal TS has a Low level, the print reference signal generating circuit 46 generates the print reference signal PTS on the basis of output signal DP1 when the sensor selection signal SS has a Low level, while the print reference signal generating circuit 46 generates the print reference signal PTS is generated on the basis of the output signal DP2 when the sensor selection signal SS has a Hi level. Moreover, when the timer selection signal TS has a Hi level, the print reference signal generating circuit 46 generates the print reference signal PTS, which has the same period as an internal set period (average period Tavg to be described later), regardless of a signal value of the sensor selection signal SS. In addition, details of the first and second delay processing circuits 43 and 44 and the sensor selection circuit 45 will be described later.

FIG. 8 shows a block diagram of a delay processing circuit. Hereinafter, the circuit configuration of a delay processing circuit is described with reference to FIG. 8. Here, since the first delay processing circuit 43 and the second delay processing circuit 44 have the same circuit configuration, an explanation will be made in FIG. 8 without particularly distinguishing between the first delay processing circuit 43 and the second delay processing circuit 44. Therefore, for reference numerals of signals related to the circuit, the signals are denoted as an encoder signal ES, an output signal DP, a lower limit detection signal LS, an upper limit detection signal US, and a missing detection signal PLS.

As shown in FIG. 8, the delay processing circuit 43 (44) includes a mask processing portion 51 and a delay processing portion 52.

The mask processing portion 51 is a processing circuit portion to which the encoder signal ES and the reference clock signal CL are input and which generates an output mask MS (mask pulse), the upper limit detection signal US, the lower limit detection signal LS (also called a first lower limit detection signal), and a second lower limit detection signal KS. In addition, the delay processing portion 52 is a processing circuit portion that generates the output signal DP using the encoder signal ES and the output mask MS and the detection signals US, LS, and KS generated in the mask processing portion 51.

First, the circuit configuration of the mask processing portion 51 will be described. As shown in FIG. 8, the mask processing portion 51 includes an encoder signal period measuring portion unit (hereinafter, simply referred to as a 'period measuring portion 53'), an encoder signal period storage portion (hereinafter, simply referred to as a 'period storage portion 54'), an average period calculating portion 55, a pulse missing detector 56, an upper and lower limit calculating portion 57, a mask generating circuit 58, an upper limit detector 59, a first lower limit detector 60, and a second lower limit detector 61.

The period measuring portion 53 is input with the encoder signal ES from the encoder sensor 27A (27B), which forms the linear encoder 28 (29), and the reference clock signal CL from the clock circuit 42 and measures a pulse period for every pulse of the encoder signal ES. Specifically, the period measuring portion 53 measures a pulse period by counting the number of pulses of the reference clock signal CL, which is input from rising of one pulse of the encoder signal ES to rising of a next pulse, with a counter (not shown). This period measurement result is sequentially transmitted from the period measuring portion 53 to the pulse missing detector 56, the upper limit detector 59, the first lower limit detector 60, and the second lower limit detector 61 for every clock count up, and a comparison operation is performed in real time in each of the detectors 56 and 59 to 61.

A result of an OR operation between the encoder signal ES and the missing detection signal PLS from the pulse missing detector 56, which is performed by an OR circuit (not shown), is input as a first latch signal to the period storage portion 54, and the period measurement result of the period measuring portion 53 is latched to the period storage portion 54 at rising timing of a first latch signal. In addition, a storage period from the period storage portion 54 is latched to the average period calculating portion 55 in a state of being delayed by a half period at rising timing of a second latch signal that is an inversion signal of the first latch signal.

The average period calculating portion 55 calculates an average period (pulse period average) Av(n) of an encoder pulse on the basis of the following expression (1) using the storage period of the period storage portion 54 as data for period average calculation.

$$Av(n)=(Av(n-1)\times(Q-1)+Tn)/Q \qquad (1)$$

Here, Av(n) is an average period this time (n-th time), Av(n−1) is an average period in previous time ((n−1)-th time), and Q is the average number of data (number of measured period data). The average period calculating portion 55 includes a storage portion (for example, a register) that stores past data used for calculation of an average period. In the storage portion, the average period Av(n−1) in previous time ((n−1)-th time) and the number of data Q are stored. For example, the number of data Q is a numeric value, such as maximum '16', '64', '128', and '256'. It is possible to calculate the average period Av(n) almost equal to averaging 'Q' measured period data only by preparing a storage region where the previous average period Av(n−1) and the number of data Q can be stored. The average period Av(n) calculated by the average period calculating portion 55 is transmitted to the pulse missing detector 56, the upper and lower limit calculating portion 57, and the first lower limit detector 60.

The pulse missing detector 56 compares and determines whether or not the conditional expression shown in the following expression (2) is satisfied on the basis of the measured period that the period measuring portion 53 has measured this time and the average period Av(n) input from the average period calculating portion 55.

$$\text{Measured period } Tnew > \text{average period } Av(n) \times \text{detection setting value } B \qquad (2)$$

Here, the detection setting value B is a set value that decides a rate related to determining that there is pulse missing (pulse lack) when a period for which a pulse does not appear becomes how many times of the average period Av(n). The detection setting value B is set to a value in a range of 1.3 to 2, for example. The pulse missing detector 56 outputs the pulse missing detection signal PLS that has a Hi level at the time of pulse missing detection in which the conditional expression Tnew>Av(n)×B shown in the expression (2) is satisfied and has a Low level at the time of no detection of pulse missing. Here, since the period measuring portion 53 transmits a period measurement result to the pulse missing detector 56 for every clock count up, a comparison operation is performed in real time in the pulse missing detector 56. In addition, 'measured period Tnew>storage period Told×detection setting value B' may be used as the conditional expression for pulse missing detection by using the storage period of the period storage portion 54 instead of the average period Av(n).

The upper and lower limit calculating portion 57 calculates values of ±H (%) of the average period Av(n) as a lower limit Tmin and an upper limit Tmax. The lower limit Tmin is expressed as Tmin=Av(n)×(100−H)/100, and the upper limit Tmax is expressed as Tmax=Av(n)×(100+H)/100. For example, if H (%) is 2%, the lower limit Tmin is calculated as Tmin=Av(n)×0.98, and the upper limit Tmax is calculated as Tmax=Av(n)×1.02. The lower limit Tmin and the upper limit Tmax are transmitted to the mask generating circuit 58, the upper limit Tmax is transmitted to the upper limit detector 59, and the lower limit Tmin is transmitted to the first lower limit detector 60. In addition, a setting value of H (%) that decides a period limiting value (upper and lower limits) is set at the time of shipment or by a user.

The mask generating circuit 58 is input with the reference clock signal CL, the encoder signal ES, and the upper and lower limits and generates the output mask MS with a pulse width that has a Hi level over a range of ±H (%) with the average period Av(n) as the center. That is, the output mask MS is generated as a pulse, which a Hi level in a range between the lower limit Tmin (=Av(n)×(100−H)/100) and the upper limit Tmax (=Av(n)×(100+H)/100), with the average period Av(n) as the center. The mask generating circuit 58 includes a counter, for example. The mask generating circuit 58 makes a pulse rise when a clock count value measured on the basis of the encoder signal ES reaches the mask lower limit Tmin and makes the pulse fall when the clock count value reaches the mask upper limit Tmax. Then, by repeating this operation, the output mask MS that has a pulse width Av(n)×2H (%) and has a Hi level in a range between the lower limit Tmin and the upper limit Tmax with the average period Av(n) as the center is generated, for example, as shown in the timing chart of FIG. 9A. The output mask MS is transmitted to the second lower limit detector 61.

When input of a next encoder pulse is not detected until a mask upper limit from a point of time when the one-previous encoder pulse is input, the upper limit detector 59 outputs the upper limit detection signal US that changes to a Hi level when the measured period reaches the mask upper limit Tmax and changes to a Low level when the next encoder pulse is input. Specifically, the upper limit detector 59 is input with the measured period, and the upper limit Tmax, and the encoder signal ES and makes a pulse rise at a point of time when the measured period, which is a count value of the number of clock pulses from a point of time when the one-previous encoder pulse is input to a point of time when the next encoder pulse is input, exceeds the mask upper limit Tmax. Thereafter, the upper limit detection signal US shown in FIG. 9A is output by making the pulse fall at a point of time when the rising edge of an encoder pulse under detection is detected.

When the rising edge of the next encoder pulse is detected until the mask lower limit Tmin from the point of time when the one-previous encoder pulse is input, the first lower limit detector 60 shown in FIG. 8 makes a pulse rise by outputting a Hi level at a point of time when the measured period reaches a mask center position (=average period Av(n)) and makes the pulse fall to the Low level at a point of time when the falling edge of the encoder pulse under detection is detected or the measured period reaches the mask upper limit, thereby outputting the first lower limit detection signal LS shown in FIG. 9A. Specifically, the first lower limit detector 60 is input with the measured period, the mask lower limit Tmin, the encoder signal ES, and the average period Av(n). When the rising edge of an encoder pulse under detection is detected before the measured period, which is a count value of the number of clock pulses from the point of time when the one-previous encoder pulse is input to the point of time when the next encoder pulse is input, reaches the mask lower limit Tmin, the first lower limit detector 60 makes a pulse rise at a point of time when the measured period reaches the mask central value (=average period Av(n)) and makes the pulse fall at a point of time when the measured period reaches the mask upper limit Tmax, thereby outputting the first lower limit detection signal LS (lower limit detection signal).

When the rising edge of the next encoder pulse is detected until the mask lower limit from a point of time when the one-previous encoder pulse is input, the second lower limit detector 61 shown in FIG. 8 makes a pulse rise by outputting a Hi-level signal at a point of time when the measured period reaches the mask lower limit Tmin and makes the pulse fall by outputting a Low-level signal at a point of time when the measured period reaches the mask upper limit, thereby outputting the second lower limit detection signal KS shown in FIG. 9A. Specifically, the second lower limit detector 61 is input with the measured period, the mask lower limit Tmin, the mask upper limit Tmax, and the encoder signal ES. When the rising edge of an encoder pulse is detected before the measured period, which is a count value of the number of clock pulses from the point of time when the one-previous encoder pulse is input to the point of time when the next encoder pulse is input, reaches the mask lower limit Tmin, the second lower limit detector 61 makes a pulse rise at a point of time when the measured period reaches the mask lower limit Tmin and makes the pulse fall at a point of time when the measured period reaches the mask upper limit Tmax, thereby outputting the second lower limit detection signal KS. In this manner, the mask processing portion 51 generates the output mask MS, the missing detection signal PLS, the upper limit detection signal US, the first lower limit detection signal LS, and the second lower limit detection signal KS.

Next, the delay processing portion 52 will be described. The delay processing portion 52 generates the output signal DP using the encoder signal ES and the detection signals PLS, US, LS, and KS generated in the mask processing portion 51. Here, the output signal DP is a signal used as a reference when generating the print reference signal PTS.

Hereinafter, the configuration and operation of the delay processing portion 52 will be described with reference to FIG. 8 while referring to the timing chart used to describe delay processing shown in FIG. 9B.

As shown in FIG. 8, the delay processing portion 52 includes a first signal generating portion 63, a second signal generating portion 64, various logic circuits, and the like.

Processing until the output signal DP is generated from the encoder signal ES and the detection signals PLS, US, LS1, and LS2 generated in mask processing is performed as follows.

An output A1 of an AND circuit 65 is generated by an AND operation between the encoder signal ES and the output mask MS. As the output A1, at the time of an encoder pulse in which the rising edge has been detected within a mask period range and an encoder pulse detected to have a period shorter than the mask lower limit, a pulse that rises at the same time as the rising time of the encoder signal ES and falls at the mask upper limit in the former case and that rises at the mask lower value and falls at the mask upper limit in the latter case is output. At the time of an encoder pulse having a period exceeding the mask upper limit, a pulse is not generated.

Then, an EXOR circuit 66 generates an output A2 by performing an exclusive OR operation between the output A1 and the second lower limit detection signal KS. As the output A2, a pulse that rises at the same time as the rising time of the encoder signal ES and falls at the mask upper limit Tmax only at the time of an encoder pulse, in which the rising edge has been detected within the mask period range, appears.

At the same time, an AND circuit 67 performs an AND operation between the output A1 and the first lower limit detection signal LS, such that an output B1 in which only a correction pulse, which rises at the mask central value Av(n) and falls at the mask upper limit Tmax, appears is generated at the time of an encoder pulse in which the rising edge has been detected exceeding the mask upper limit Tmax. In addition, an output signal B2 is generated as a result of an OR operation between the output B1 and the output A2 using an OR circuit 68 (refer to FIG. 9B). This output B2 is input to the first signal generating portion 63.

The first signal generating portion 63 outputs the output signal B2 by delaying the rising edge of the output signal B2 by Dt and makes the pulse fall at the time when an interval W has passed from the rising time, thereby generating an output signal C shown in FIG. 9B. Here, the delay time Dt is a fixed value. The delay time Dt is preferably calculated by the following expression using a period ZT that is measured beforehand or is set for every device.

$$Dt = ZT \times 2H/100 \qquad (3)$$

Here, 'ZT' is an average period of an encoder signal, and 'H' is a period limit percentage. For example, $Dt=ZT\times0.04$ if H=2%. The value of Dt is only an example, and a proper value may be set.

On the other hand, an AND circuit 70 generates an output signal D by performing an AND operation between the upper limit detection signal US and a result of a NOT operation of the missing detection signal PLS in a NOT circuit 69. As shown in FIG. 9B, the output signal D is a pulse that rises at the mask upper limit Tmax and falls at a point of time of detection of the rising edge of an encoder pulse or at a point of time of pulse missing detection (former case in FIG. 9B) at the time of an encoder pulse in which the rising edge has not been detected until the mask upper limit Tmax. The output D is input to the second signal generating portion 64.

The second signal generating portion 64 shown in FIG. 8 outputs the output signal D by delaying the rising edge of the output signal D by UDt and makes the pulse fall at the time when the interval W has passed, thereby generating an output signal E shown in FIG. 9B. In this example, the delay time UDt is calculated by the following expression.

$$UDt = Dt - Av(n) \times H/100 \quad (4)$$

Here, 'Dt' is a delay time in the first signal generating portion 63, 'Av(n)' is an average period, and 'H' is a period limit percentage.

As shown in FIG. 8, the output signal C and the output signal E are input to an OR circuit 71, and a result of an OR operation between both the output signals C and E is output as the output signal DP. The output signal C is a pulse which has a pulse width W and in which the rising edge of the encoder signal ES, which rises within the mask range, is used as it is and the encoder signal ES, which rises with a period equal to or smaller than the mask lower limit, is corrected to a signal rising at the mask central value Av(n) and the rising time is delayed by the delay time Dt. The output signal E is a pulse that rises after being delayed by the delay time UDt (period obtained by subtracting time 'Av(n)×H' of the half of a mask range from the delay time Dt). That is, the output signal E is a pulse which has the pulse width W and in which the rising time is corrected to the position delayed by Dt from the mask central value Av(n). Therefore, the output signal DP becomes a signal that rises after period monitoring using the mask ends, resulting in a signal whose period tn(pn) falls within a limit range (Av(n)×(1−H/100)≦tn(pn)≦Av(n)×(1+H/100)).

Figure 10:
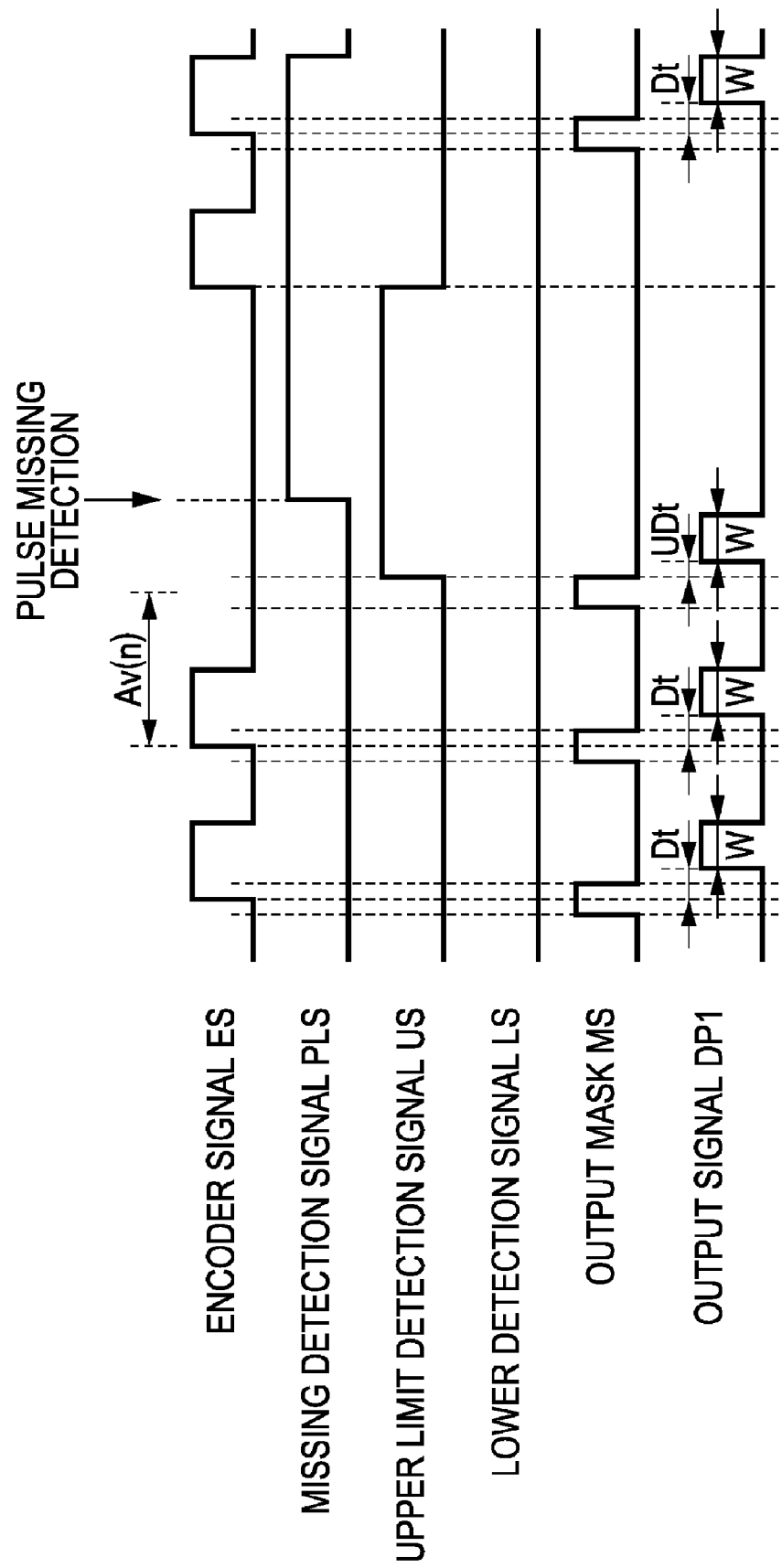
FIG. 10 is a signal timing chart when pulse missing is detected in a delay processing circuit.

FIG. 10 is a timing chart illustrating the output signal generating timing of a delay processing circuit when pulse missing occurs. As shown in FIG. 10, when pulse missing occurs, the upper limit detection signal US first rises from a Low level to a Hi level by the upper limit detector 59 at a point of time when a measured period exceeds the mask upper limit. Then, the missing detection signal PLS rises from the Low level to the Hi level at a point of time when the measured period exceeds Av(n)×B and pulse missing is detected by the pulse missing detector 56. In this case, the upper limit detection signal US rises in a state where the missing detection signal PLS is in a Low level. Accordingly, since a pulse appears in the output D of the AND circuit 70 (refer to FIGS. 8 and 9B), a pulse is generated in the output signal DP before pulse missing detection. Then, after pulse missing ends with the pulse as a final pulse and until input of one encoder pulse is completed, a pulse is not generated in the output signal DP1. Thus, a pulse of the print reference signal PTS is generated without using the output signal DP1 when pulse missing is detected.

Figure 11:
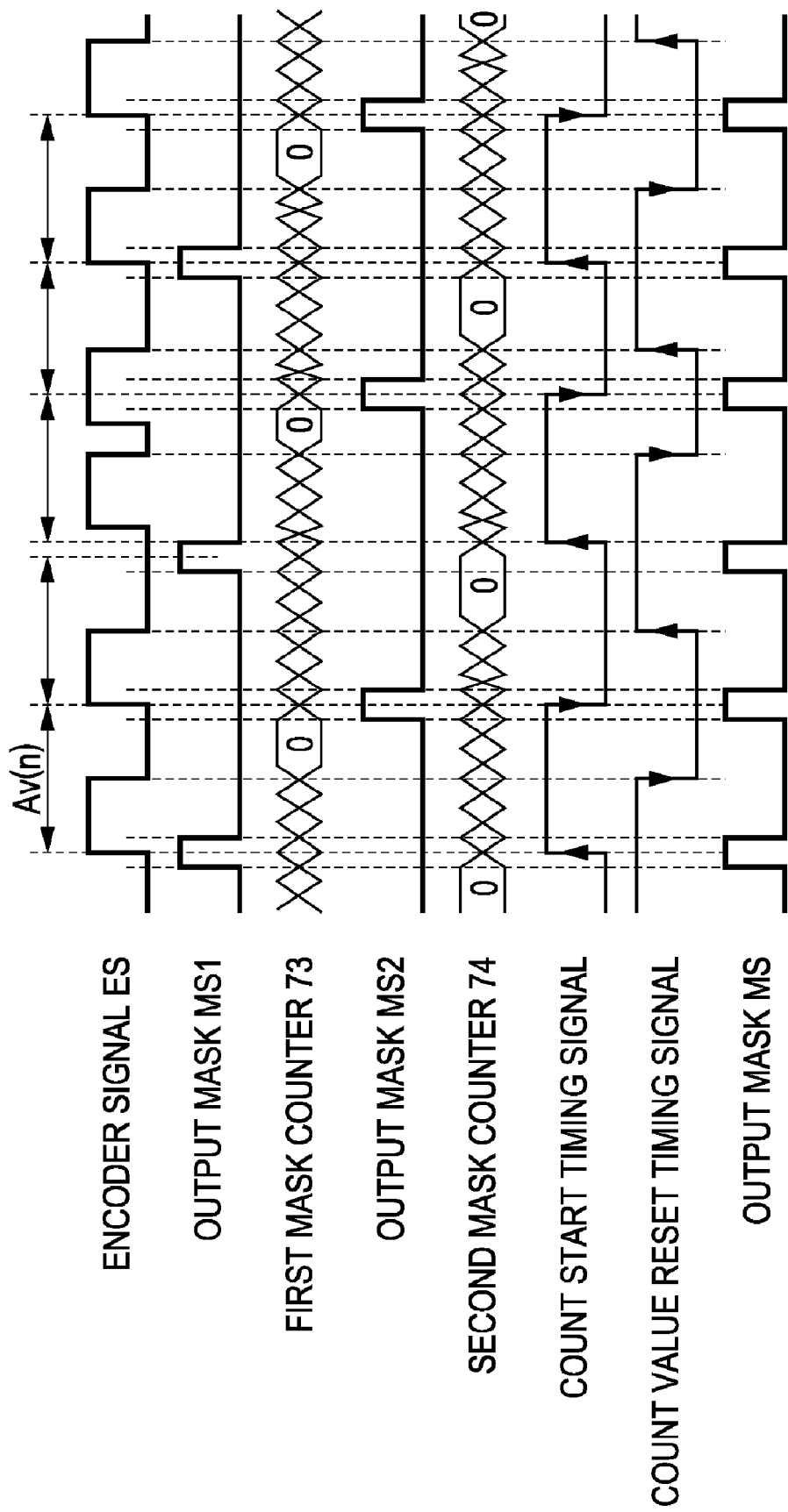
FIG. 11 is a timing chart illustrating an operation of a mask generating circuit.

FIG. 11 shows the timing chart of the output mask generating timing of a mask generating circuit.

The mask generating circuit 58 includes a pair of mask generating circuit portions (not shown) having counters, for example. The pair of mask generating circuit portions generate output masks MS1 and MS2, respectively, on the basis of the encoder signal ES and the average period Av(n) and generate the output mask MS as a result of an OR operation between the two kinds of output masks MS1 and MS2 using an AND circuit (not shown).

A first mask counter 73 that forms one mask generating circuit portion starts counting by falling of a count start timing signal, which is a signal obtained by dividing a frequency of the encoder signal ES by 2 at the time of rising and is reset to 0 by falling of a count value reset timing signal, which is a signal obtained by dividing a frequency of the encoder signal ES by 2 at the time of falling. Here, when an encoder pulse is input before the period limit time, the count start timing signal is changed at a point of time when the counter value reaches the time of a central value of the period limit time. When an encoder pulse is not input within the period limit time, the count start timing signal is changed at a point of time when the counter value reaches the upper-limit period limit time. Limitation measurement of the rising time of the count start timing signal is performed by a second mask counter 74, and limitation measurement of falling time is performed by the first mask counter 73. By this operation, reset and start of a counter signal are repeated unless pulse missing occurs.

In addition, the output mask MS1 is made to rise at the time when the count value of the first mask counter 73 reaches the lower limit Tmin=Av(n)×(100−H)/100 of a period limit range, and the output mask MS1 is made to fall at the time when the count value reaches the upper limit Tmax=Av(n)×(100+H)/100 of the period limit range. This operation is repeated such that the output mask MS1 is generated for every other pulse. The output mask MS2 is generated in the same method as the output mask MS1 by using a count value of the second mask counter 74. In addition, a result of an OR operation between the output mask MS1 and the output mask MS2 using an AND circuit (not shown) is generated as the output mask MS.

FIG. 12A shows the circuit configuration of the sensor selection circuit 45, and FIG. 12B shows the timing chart of an input/output signal of the sensor selection circuit 45. The sensor selection circuit 45 is a circuit to which error signals Er1 and Er2 are input and which outputs the sensor selection signal SS with a Low level when the error signal Er1 has a Hi level and outputs the sensor selection signal SS with a Hi level when the error signal Er2 has a Hi level.

As shown in FIG. 12A, the sensor selection circuit 45 is configured to include: an AND circuit 77 to which the error signal Er2, which is a Reset input, and an inversion signal of the error signal Er1 that is a Set input, which is obtained through a NOT circuit 76, are input; and an RS-FF (reset flip-flop) to which an output of the AND circuit 77 is Reset input and the error signal Er1 is Set input. The RS-FF includes a NOR circuit 78 to which the output of the AND circuit 77 is input and a NOR circuit 79 to which the error signal Er1 is input. The NOR circuits 78 and 79 are connected such that an output of each of the NOR circuits 78 and 79 becomes an input of the other NOR circuit. The RS-FF outputs the sensor selection signal SS from a Q terminal.

As shown in the timing chart of the sensor selection circuit 45 of FIG. 12B, both the error signals Er1 and Er2 input to the sensor selection circuit 45 have Low levels at the time of normal period detection and has Hi levels at the time of abnormal period detection. When the error signal Er1 rises, the sensor selection signal SS rises from the Low level to the Hi level. On the other hand, the sensor selection signal SS is made to fall when the error signal Er2 rises in a state where the error signal Er1 has a Low level. Accordingly, the error signal Er1 rises when the first encoder sensor 27A detects period abnormalities and the sensor selection signal SS rises from the Low level to the Hi level, such that switching between encoder sensors is performed. Then, the period abnormality detection of the first encoder sensor 27A is not performed (that is, returning to the normal period). As a result, even if the error signal Er1 falls, returning to the first encoder sensor 27A is not performed until the error signal Er2 rises next by period abnormality detection of the second encoder sensor 27B.

For this reason, the sensor selection circuit 45 suppresses frequent switching between the first and second encoder sensors 27A and 27B. The sensor selection circuit 45 performs switching between encoder sensors only when the period abnormalities are detected by an encoder sensor in use and the other encoder sensor is normal. This further reduces a frequency of using an unstable signal immediately after returning from an abnormal period to a normal period.

Figure 13:
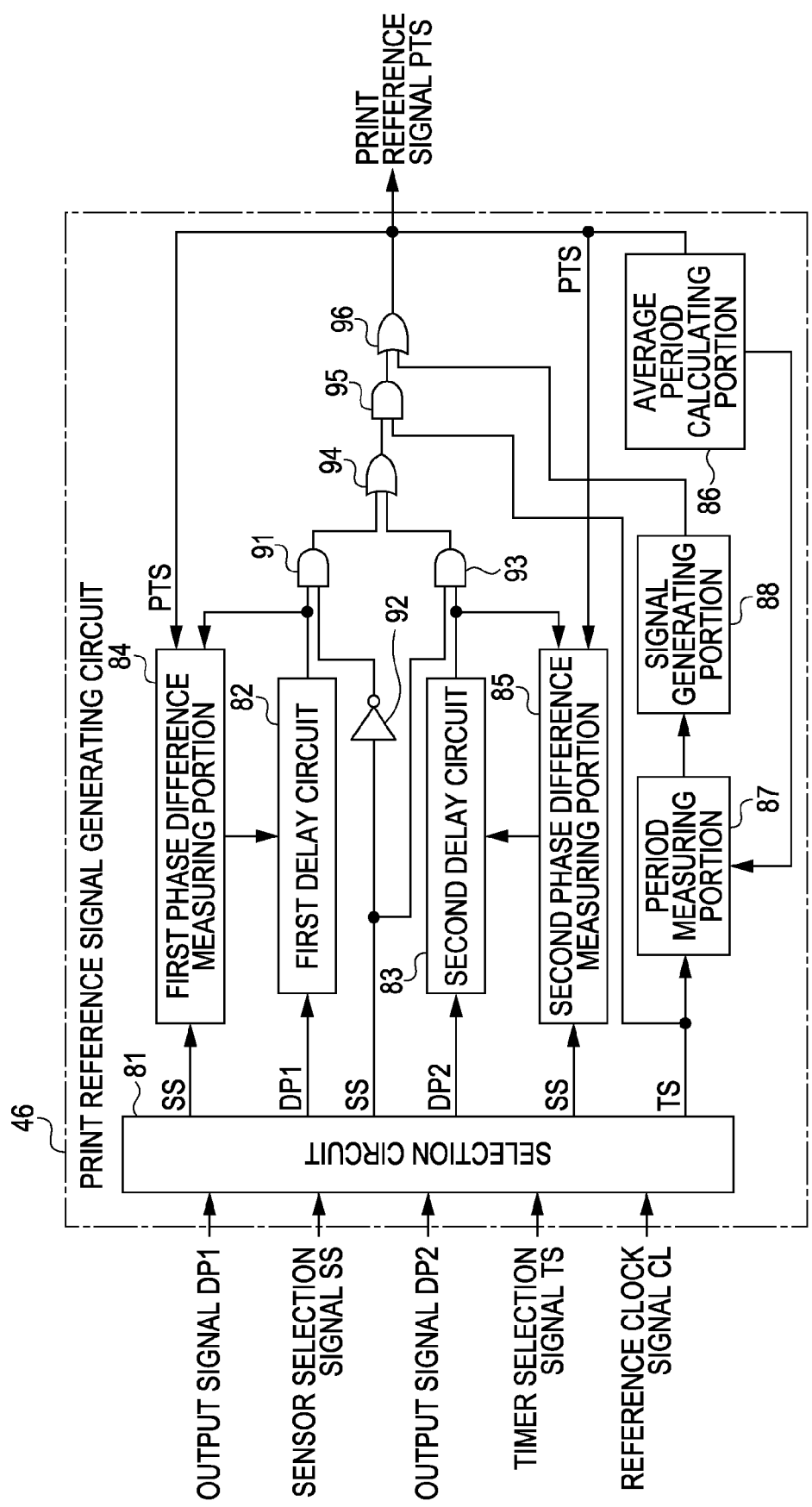
FIG. 13 is a circuit diagram illustrating the electrical configuration of a print reference signal generating circuit.

FIG. 13 shows the schematic circuit configuration of the print reference signal generating circuit 46.

The print reference signal generating circuit 46 includes a selection circuit 81, a first delay circuit 82, a second delay circuit 83, a first phase difference measuring portion 84, a second phase difference measuring portion 85, an average period calculating portion 86, a period measuring portion 87, and a signal generating portion 88. The signals DP1, DP2, SS, TS, and CL input to the print reference signal generating circuit 46 are input to the selection circuit 81. Moreover, although not shown, the reference clock signal CL is input from the selection circuit 81 to each of the portions 82 to 88.

The selection circuit 81 controls measurement operations of the first phase difference measuring portion 84 and the second phase difference measuring portion 85 on the basis of the sensor selection signal SS. That is, the selection circuit 81 stops measurement of a phase difference performed by a phase difference measuring portion corresponding to an encoder sensor that detects the period abnormalities and makes measurement of a phase difference performed by a phase difference measuring portion corresponding to an encoder sensor that has returned to a normal period detection state.

For example, if the sensor selection signal SS has a Hi level, the selection circuit 81 stops measurement of the phase difference dn performed by the first phase difference measuring portion 84 and makes measurement of the phase difference Dn performed by the second phase difference measuring portion 85. In addition, if the sensor selection signal SS has a Low level, the selection circuit 81 stops the measurement of the phase difference Dn performed by the second phase difference measuring portion 85 and makes the measurement of the phase difference dn performed by the first phase difference measuring portion 84.

Moreover, when the timer selection signal TS changes to a Hi level, the selection circuit 81 outputs the Hi level to the period measuring portion 87 to thereby start the period measuring portion 87. The period measuring portion 87 functions as a timer that measures a predetermined time by counting a clock count value. The period measuring portion 87 starts measuring the time at the timing, at which a previous pulse of the print reference signal PTS has finished the period, with a time when the signal generating portion 88 has made a pulse rise as a starting point.

The average period calculating portion 86 is input with the print reference signal PTS and measures a period for every pulse, and calculates an average period from a plurality of measured periods and temporarily stores the average period. The same method as the average period calculating portion 55 shown in FIG. 8 that measures the average period Av(n) of the encoder signal ES is adopted as the average period calculating method. Using the following expression (5) in the same manner, calculation is performed using the previous average period Tavg, a current measured period Tpts, and the number of data Q.

$$Tavg(n)=Tavg(n-1)\times(Q-1)+T(n)/Q \quad (5)$$

Here, Tavg(n) is an average period this time (n-th time), Tavg(n−1) is an average period in previous time ((n−1)-th time), and Q is the average number of data (number of measured period data). The average period calculating portion 86 includes a storage portion (for example, a register) that stores past data used for calculation of the average period Tavg. In the storage portion, the average period Tavg(n−1) in previous time ((n−1)-th time) and the number of data Q are stored.

An inversion signal, which is obtained when the sensor selection signal SS is inverted in a NOT circuit 92, and an output signal from the first delay circuit 82 are input to an AND circuit 91. A result of an AND operation between both the signals is output from the AND circuit 91. In addition, the sensor selection signal SS and an output signal from the second delay circuit 83 are input to an AND circuit 93. A result of an AND operation between both the signals is output from the AND circuit 93.

An OR operation between the outputs of both the AND circuits 91 and 93 is performed by an OR circuit 94, and an AND operation of an output of the OR circuit 94 and the timer selection signal TS is performed by an AND circuit 95. Accordingly, when the timer selection signal TS has a Hi level, an output of the AND circuit 95 has a Low level. Then, the output of the AND circuit 95 and the output from the signal generating portion 88 are input to an OR circuit 96, and a result of an OR operation between both the outputs is output as the print reference signal PTS.

Figure 14:
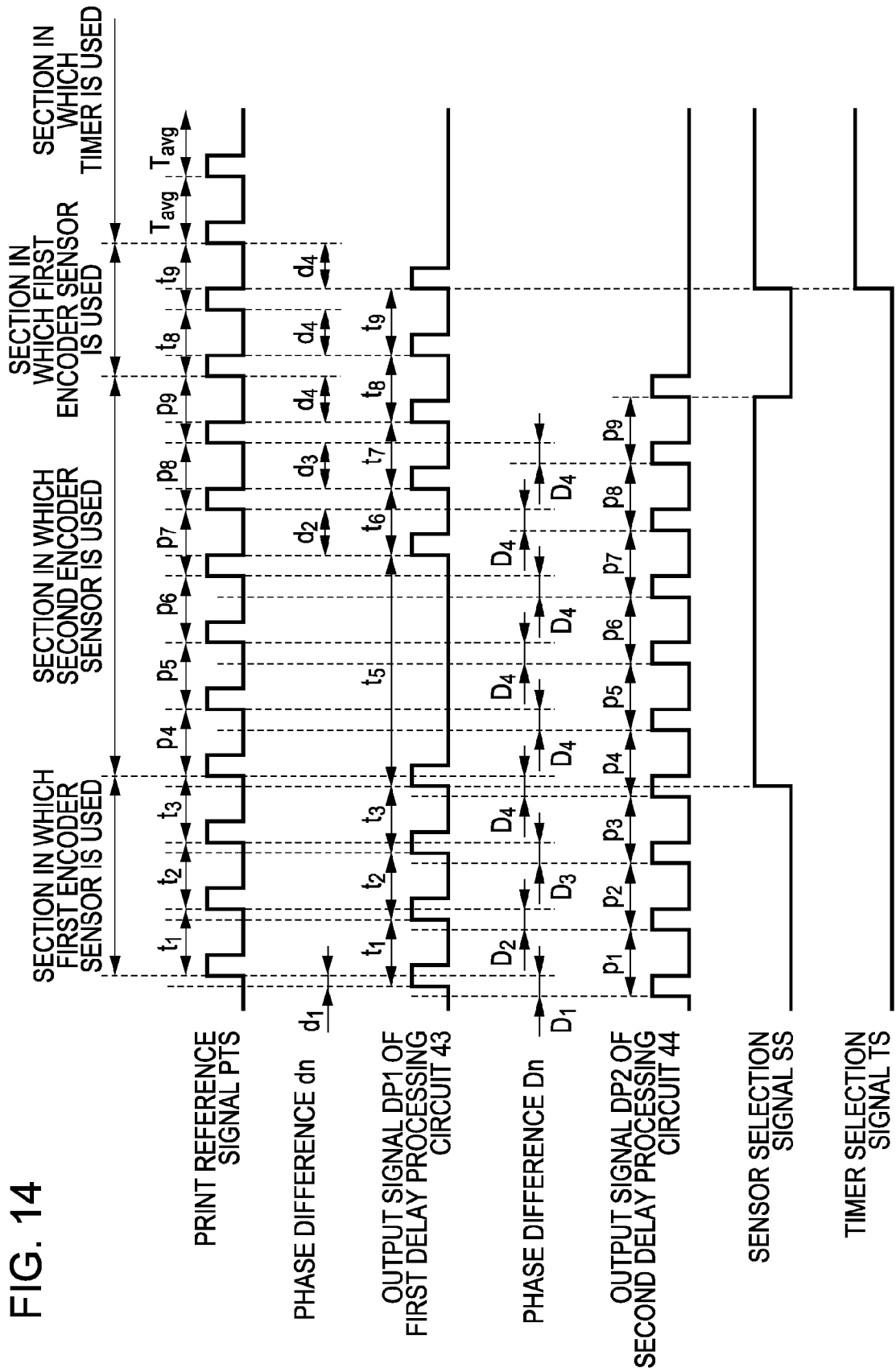
FIG. 14 is a timing chart illustrating an operation of a print reference signal generating device.

FIG. 14 shows a timing chart illustrating an operation of the print reference signal generating device 41 in the present embodiment. In addition, in the following description, the output signal DP1 of the first delay processing circuit 43 may be called a 'first output signal DP1', and the output signal DP2 of the second delay processing circuit 44 may be called a 'second output signal DP2'. In the timing chart of FIG. 14, the phase difference dn indicates a phase difference measured by the first phase difference measuring portion 84 and the phase difference Dn indicates a phase difference measured by the second phase difference measuring portion 85.

In the print reference signal generating circuit 46, the first output signal DP1 from the first delay processing circuit 43 is selected when the sensor selection signal SS has a Low level, such that the print reference signal PTS is generated. The pulse edge of the first output signal DP1 is delayed by a delay amount (adjustment time), which corresponds to a newest phase difference d1 measured by the first phase difference measuring portion 84, by the first delay circuit 82. As a result, the print reference signal PTS is generated. Pulses in the next periods t2 and t3 of the first output signal DP1 are also delayed similarly by the delay amount corresponding to the phase difference d1. As a result, a pulse period of the first output signal DP1 is stored as the pulse period of the print reference signal PTS. In this manner, the print reference signal PTS can be generated such that the pulse period of the print reference signal PTS becomes equal to the pulse period of the first output signal DP1, even if period information is not stored.

While the print reference signal PTS is being generated on the basis of the first output signal DP1 by this operation, the second phase difference measuring portion 85 in the print reference signal generating circuit 46 measures the phase difference Dn between the second output signal DP2 and the print reference signal PTS and makes sequential changes. Therefore, as shown in FIG. 14, in a section in which a first encoder sensor is used, a phase difference between each pulse of the second output signal DP2 and a pulse of the print reference signal PTS is sequentially updated like D1, D2, . . . . In addition, the first and second phase difference measuring portions 84 and 85 measure the phase differences dn and Dn as clock count values input from a point of time when an internal counter detects the pulse rising edges of the output signals DP1 and DP2 to a point of time when the internal counter detects the pulse rising edge of the print reference signal PTS.

Then, for example, when pulse missing occurs in the encoder signal ES1 to cause the missing detection signal PLS1 to change to a Hi level, the sensor selection signal SS changes to a Hi level. When the print reference signal generating circuit 46 detects that the sensor selection signal SS has a Hi level, the selection circuit 81 stops measurement of the phase difference Dn performed by the first phase difference measuring portion 84. Almost at the same time, the second delay circuit 83 delays the second output signal DP2 by the delay amount (adjustment time) corresponding to the phase difference Dn on the basis of the newest phase difference Dn (phase difference D4 in the example of FIG. 14) measured by the second phase difference measuring portion 85 and then outputs the delayed second output signal DP2 as the print reference signal PTS. In a section in which a second encoder sensor is used, pulses in the next periods p5, p6, . . . , p9 of the second output signal DP2 are also delayed similarly by the delay amount corresponding to the phase difference D4. As a result, a pulse period of the second output signal DP2 is stored as the pulse period of the print reference signal PTS.

On the other hand, after switching to the second encoder sensor used section, the phase difference dn between the print reference signal PTS and the first output signal DP1 is measured by the first phase difference measuring portion 84 after a pulse of the first output signal DP1 is input. As shown in FIG. 14, in the second encoder sensor used section, a phase difference between each pulse of the first output signal DP1 and a pulse of the print reference signal PTS is sequentially updated like d2, d3.

Then, when pulse missing occurs in the encoder signal ES2 to cause the missing detection signal PLS2 to change to a Hi level, the sensor selection signal SS changes to a Low level again. Then, the first delay circuit 82 outputs the print reference signal PTS by delaying the first output signal DP1 using the newest phase difference dn ('D4' in the example of FIG. 14) measured by the second phase difference measuring portion 85. In the meantime, the phase difference Dn is not measured until the second output signal DP2 is input. Moreover, while the print reference signal PTS is being output, the average period calculating portion 86 calculates the average period Tavg (average period value) for a plurality of pulses by measuring the pulse period of the print reference signal PTS. The calculation of the average period Tavg is performed according to the above expression (5) using the previous average period Tavg(n−1), the current measured period T(n), and the number of data Q.

Then, as shown in FIG. 14, when pulse missing occurs simultaneously in the two encoder sensors 27A and 27B, the timer selection signal TS changes to a Hi level. Then, the signal generating portion 88 generates a pulse such that a pulse of the average period Tavg calculated by the average period calculating portion 86 is connected to a previous pulse of the print reference signal PTS and outputs the pulse as the print reference signal PTS. At this time, when the timer selection signal TS changes to a Hi level, the signal generating portion 88 first detects the end of a period of the previous pulse of the print reference signal PTS. At a point of time when the end of the period has been detected, the signal generating portion 88 makes the pulse rise and at the same time, starts measurement of the period measuring portion 87. Then, when the measured period of the period measuring portion 87 that started the measurement from the rising time of the pulse reaches the pulse width W, the signal generating portion 88 makes the pulse fall. Furthermore, when the measured period reaches the average period Tavg, the signal generating portion 88 makes the pulse rise. Thereafter, the print reference signal PTS is output by generating a pulse having the average period Tavg as a period by repeating the above operation while the timer selection signal TS has a Hi level.

As a result, even if pulse missing occurs in both the output signals DP1 and DP2, the print reference signal PTS without pulse missing can be generated by interpolating a pulse.

By repeating the above operation, it becomes possible to generate the print reference signal PTS, in which period deviation at the time of encoder sensor switching is suppressed to the minimum, even in the case where there is a phase difference in the encoder signals ES1 and ES2 output from the two encoder sensors 27A and 27B. Moreover, even in the case where pulse missing (pulse lack) occurs simultaneously in two encoder sensors 27A and 27B, the signal generating portion 88 generates the print reference signal PTS in a pulse with the average period Tavg since the period measuring portion 87 determines rising and falling timing of a pulse by measuring the time using the average period Tavg calculated by the average period calculating portion 86. As a result, pulse lack in the print reference signal PTS can be prevented.

In the printer 11 mounted with the transport belt 16 as described above, the print reference signal PTS is generated on the basis of the encoder signals ES1 and ES2 from the encoder sensors 27A and 27B by the print reference signal generating device 41 in the controller 30. In addition, by ejecting ink from nozzles of the recording head 25, for example, with the rising time of the print reference signal PTS as ejection timing so that ink droplets land on the recording paper S, an image or a character is printed. At this time, the print reference signal PTS is generated by delaying the output signals DP1 and DP2 the periods of which fall within the limit range. Accordingly, a signal without period abnormalities is generated. In addition, even if pulse missing occurs because a portion of the joint J of the transport belt 16 is detected or foreign matters, such as paper particles, adhere to the magnetic linear scale 26, switching to an output signal on the other encoder sensor side is performed. For this reason, even if pulse missing occurs in one encoder sensor in use, the print reference signal PTS with a stable period can be generated by switching to the other encoder sensor. Furthermore, since an adjustment for interpolating a phase difference between the print reference signal PTS and the output signal is performed at the time of switching of an encoder sensor (at the time of switching of an output signal), a pulse without period abnormalities caused by phase shift is generated.

As described above, according to the first embodiment, the following effects are obtained.

(1) The phase difference measuring portions 84 and 85 that measure and manage phase differences between the output signals DP1 and DP2 and the print reference signal PTS were provided. In addition, the configuration where at the time of encoder sensor switching, the print reference signal PTS is generated by performing delay processing using the delay circuit 82 or 83 of a switching destination with a delay amount corresponding to the phase difference between the print reference signal PTS and the output signal on a side of an encoder sensor of the switching destination was adopted. Therefore, even if period abnormalities are detected by an encoder sensor in use and switching of an output signal is performed, the period abnormalities caused by the phase difference between pulses before and after switching can be effectively suppressed. As a result, the print reference signal PTS with an appropriate period can be generated.

(2) When pulse lack in the encoder signal ES caused by the joint of the transport belt 16 or sudden pulse lack caused by adhesion of paper particles or ink mist occurs and pulse missing occurs simultaneously in both the encoder sensors 27A and 27B, the print reference signal PTS having the same period as the average period Tavg as a period is generated because the signal generating portion 88 generates a pulse on the basis of a time, at which the period measuring portion 87 (timer) measures a period, such that one period ends when the time reaches the average period Tavg. Therefore, even in the case where pulse missing is detected by all of a plurality of encoder sensors, the print reference signal PTS without pulse lack can be generated and pulse missing can be interpolated by a pulse with an appropriate period. For example, the pulse lack in the print reference signal PTS causes an ink discharge error of the recording head 25, resulting in a cause of significantly lowering the printing quality of an image. However, according to the printer 11 including the print reference signal generating device 41 in the present embodiment, good printing quality can be provided by avoiding such a disadvantage.

(3) Of the first and second phase difference measuring portions 84 and 85, the phase difference measuring portion corresponding to an output signal on a side used for generation of the print reference signal PTS stops measurement of a phase difference and holds a final a phase difference at the time of switching, while the phase difference measuring portion corresponding to an output signal on a side that is not used for generation of the print reference signal PTS performs measurement of a phase difference and sequentially performs updating for every pulse. Therefore, the print reference signal PTS can be generated with an appropriate period, which is the same period as the output signal, by delaying the output signal by continuously using the newest phase difference at the time of switching. In addition, when the output signals DP1 and DP2 are switched next time, the print reference signal PTS can be generated with an appropriate period by delaying an output signal of a switching destination using the newest phase difference.

(4) The output signals DP1 and DP2 delayed by the predetermined delay amount were generated by monitoring period abnormalities of the encoder signals ES1 and ES2 and performing period correction on a required place using the delay processing circuits 43 and 44. In addition, the print reference signal PTS was generated by delaying one output signal of the output signals DP1 and DP2, which was selected by the sensor selection signal SS from the sensor selection circuit 45, by the delay circuits 82 and 83 in the print reference signal generating circuit 46. Therefore, except for a case where both the encoder sensors 27A and 27B use the average period Tavg at the time of pulse missing detection, the print reference signal PTS with an appropriate period can be generated with a relatively simple circuit configuration even if there is no period information (period data). As a result, it is possible to reduce bit lines or the storage capacity of a data storing portion required when there is period information.

(5) An output C with the predetermined pulse width W that rises at the time, which is delayed by the time Dt from the rising time of the encoder signal ES, when a measured period falls within a mask period range, that is, when the period is normal and that rises at the time, which is delayed by the time Dt from the mask central value, when the measured period is lower than the mask lower limit, that is, when the lower limit of the period is abnormal is generated. On the other hand, an output E with the same pulse width W that rises at the time, which is delayed by the time UDt (<Dt) (time Dt viewed from the mask central value) from the mask upper limit is generated. In addition, an OR operation between the output C and the output E is performed to generate the output signals DP1 and DP2. By this processing, it becomes possible to provide a time difference in a period from detection of period abnormalities to signal output. As a result, it becomes possible to make correction to a signal with an average period even after detecting a signal with a period equal to or larger than the upper limit period. In addition, such output signals DP1 and DP2 can be relatively easily generated by logic operations of relatively simple logic circuits using the encoder signal ES, the output mask MS, the upper limit detection signal US, the first lower limit detection signal LS, and the second lower limit detection signal KS and delay processing of the first and second signal generating portions 63 and 64.

(6) Since the upper limit detector 59 that detects a point of time when a measured period exceeds the mask upper limit is provided, pulses of the output signals DP1 and DP2 can be generated by using a rising pulse of the upper limit detection signal even when pulse missing occurs. Accordingly, when pulse missing occurs, a pulse of an output signal can be generated before switching of an encoder sensor is performed at the point of time when the pulse missing has been detected. As a result, lack of a pulse of the print reference signal PTS at the timing before encoder sensor switching when pulse missing has occurred in the encoder signal ES can be reliably prevented.

(7) Since switching of an encoder sensor is performed when pulse missing is detected, the print reference signal PTS can be generated on the basis of the output signal DP output from a delay processing circuit on the encoder sensor side of the switching destination. In this case, the two encoder sensors 27A and 27B are disposed in the positional relationship in which the two encoder sensors 27A and 27B do not detect the joint J simultaneously and are also disposed such that the positions are shifted in the width direction of the magnetic linear scale 26. Accordingly, the probability that pulse missing will occur simultaneously in the two encoder sensors 27A and 27B is extremely reduced. In this case, when pulse missing occurs in one encoder sensor, pulse missing does not occur in the other encoder sensor and the print reference signal PTS can be generated on the basis of the output signals DP1 and DP2. As a result, it becomes easy to generate the print reference signal PTS with a more appropriate period compared with a case where the average period Tavg is used.

(8) Since a configuration where an output signal to be used for generation of the print reference signal PTS is switched if at least one of missing detection, upper limit detection, and lower limit detection is detected is adopted, the print reference signal PTS can be generated with a highly precise period based on the measured period even when the period abnormalities occur.

In addition, the embodiment is not limited to those described above but may be changed as follows.

(First Modification)

The phase difference adjustment (delay processing) may be performed after switching an output signal. For example, a configuration where a delay circuit is connected to a downstream side in the signal transmission direction of a switching circuit of the output signals DP1 and DP2 may be adopted. In this case, a configuration where two delay circuits are provided and the output destination of an output signal after switching is switched may be adopted. Alternatively, a configuration where one delay circuit is provided and a phase difference measuring portion, which sets the delay time for the delay circuit, is switched may be adopted.

(Second Modification)

The pulse output signals are not be limited to the output signals DP1 and DP2 but may be the encoder signals ES1 and ES2. That is, the delay processing circuit is not essential. Even if the pulse output signals are encoder signals, a pulse signal (print reference signal PTS) in which period abnormalities caused by the phase difference at the time of switching is suppressed small can be generated if a detection unit is configured to detect the abnormalities in a period lower limit shorter than a normal period, for example. In addition, in the case where the detection unit is configured to detect the abnormalities in a period upper limit longer than the normal period, even if an encoder signal is switched at a point of time when the abnormalities in the period upper limit are detected, a pulse with an upper limit abnormal period is generated at the overdue timing that already exceeds the normal period range for the previous pulse at the time of switching. Even if an encoder signal of the switching destination is a pulse with a normal period, period abnormalities that a period of the next pulse becomes shorter than the normal period due to rising delay of the pulse at the time of switching occur. In this case, if a period limit range is set small so that the abnormalities in a period upper limit can be detected quickly, the period abnormalities at the time of switching can be effectively suppressed small even though the degree of freedom in setting related to detecting an abnormal period by the detection unit is decreased. Moreover, although there is some delay in rising of a pulse when pulse missing occurs in both encoders, the print reference signal PTS without pulse missing can be generated by interpolating a pulse with a normal period close to the average period Tavg.

(Third Modification)

Instead of calculating the average period of the print reference signal in the print reference signal generating circuit 46 of FIG. 13, it may be possible to adopt a configuration where the period measuring portion 87 performs the measurement using the average calculation data Av(n) of the average period calculating portion 55 of one of the delay processing circuits 43 and 44 and the signal generating portion 88 determines a timing at which a pulse rises.

(Fourth Modification)

A reasonable period is not limited to the average period Tavg (period average). A weighted average, a cumulative weighted average, an arithmetic mean, a geometric average, a harmonic average, and the like may also be used. Moreover, values that may become unsuitable values, such as a maximum value and a minimum value, may be excluded from objects to be calculated when these averages are calculated. Furthermore, a statistically reasonable value may be used without being limited to the average. Moreover, it may be possible to derive a computation expression for calculating the reasonable value by performing statistical analyses from data, which is obtained by measuring a pulse period in the experiment, and to calculate a reasonable value using the computation expression.

(Fifth Modification)

It may be possible to adopt a configuration where switching of an output signal is not performed at the time of detection (upper limit detection, lower limit detection) of period abnormalities other than pulse missing and switching of an output signal is performed at the time of pulse missing detection. Moreover, at the time of detection of period abnormalities other than pulse missing, the pulse of the output signal may be replaced with a pulse generated by using a reasonable period, such as an average period.

(Sixth Modification)

Only one of a pulse missing detector, an upper limit detector, and a lower limit detector may be adopted as the detection unit or two of them may be adopted as the detection unit. However, it is preferable to include the pulse missing detector. It is needless to say that a detector that detects other period abnormalities may be provided and four or more kinds of detection units may be provided to detect four or more kinds of period abnormalities.

(Seventh Modification)

Although an application to the linear encoder has been made in the above embodiment, an application to a rotary encoder may also be made. In a configuration where a detection pulse of a rotary encoder is used in case of performing a rotation control of a motor, for example, a pulse signal generating device may also be applied. Moreover, the encoder is not limited to the incremental encoder, but an absolute encoder may be used.

(Eighth Modification)

The transport unit that transports a recording medium, such as paper, is not limited to using the transport belt method. For example, an application to a printer including a roller type transport device, in which a roller device configured to have a pair of driving roller and driven roller is disposed at a plurality of places on the transport path, may be made. For example, a magnetic scale may be provided on a peripheral surface of the end of a roller, or a rotary-encoder-type rotating plate magnetic scale may be provided in a rotation driving shaft of a power transmitting system or a roller. Moreover, in the case of a belt transport method in a line printer, it may also be possible to adopt a configuration where a plurality of belts are wound in a zigzag manner between rollers that are disposed in a pair at each of upstream and downstream sides in the transport direction. In addition, a configuration where a drum not having a transport belt is provided and printing is performed by a recording unit in a condition where recording paper sticks on the outer peripheral surface of the drum may also be adopted.

(Ninth Modification)

The pulse signal generating device may be applied not only to the line printer but also to a serial type printer that performs printing while a recording head is moving (scanning) in a width direction of paper, for example. For example, the print reference signal PTS is generated by providing a linear encoder in parallel with a moving path of a carriage provided with a recording head and inputting encoder signals from a plurality of sensors, which move with the carriage, to the print reference signal generating device in the embodiment.

(Tenth Modification)

In the above embodiment, three or more sensors may be provided for one linear scale. For example, a configuration where three or more encoders are provided and switching of three or more output signals to one used for pulse signal generation is performed may be adopted.

(Eleventh Modification)

The encoder (linear encoder, rotary encoder) is not limited to the magnetic type, but an optical encoder may be adopted. In the case of the optical encoder, the encoder signal ES whose amplitude periodically changes can be obtained by providing slits at fixed pitches in a scale and periodically changing the opening shape or opening area of the slit such that the light receiving amount of an optical detection sensor, which receives light that is emitted from a light source (light-emitting device) and passes through the slit, periodically changes. Moreover, in the case of the optical encoder, a reflective one may also be adopted in addition to the above-described transmissive one.

(Twelfth Modification)

The print reference signal generating device is not limited to the hardware configuration. The print reference signal generating device may be configured by software that realizes each processing portion having the same functions as the delay processing circuit, the sensor selection circuit, and the print reference signal generating circuit by causing a CPU (central processing unit) to execute a program stored in a memory.

(Thirteenth Modification)

The pulse signal generated by the pulse signal generating device is not limited to generating a print reference signal of a printer. The pulse signal generating device may also be used an encoder signal generating device, for example. For example, the encoder signal generating device may be used for detection of the speed of a transport belt or may be used for detection of the position of the transport belt. In these configurations, the precision of speed control can be increased or the precision of position control can be increased by performing the speed control and position control of an actuator, such as a motor, using the encoder signal generating device according to the embodiment of the invention. Moreover, a reference pulse signal other than the print reference signal may be generated. In this case, a reference pulse signal with a period different from a pulse signal period may be generated by multiplying or dividing a pulse signal output from the pulse signal generating device.

(Fourteenth Modification)

In each embodiment, it may be possible to adopt a configuration of notifying a user that a linear encoder or the like is to be cleaned when the pulse missing (pulse lack) detection state continues for a predetermined time.

(Fifteenth Modification)

The image forming apparatus is not limited to a printer. For example, an image forming apparatus that draws, as an image, a prescribed pattern (including a wiring line pattern, an electrode pattern, a pixel pattern, an etching pattern, and an array pattern) of an electrode material or a color material (pixel material) used for manufacturing of a liquid crystal display, an EL (electroluminescence) display, and a surface emission display may also be used. It is needless to say that the invention may also be applied to a printer other than the ink jet printer. For example, the invention may be applied to a dot impact printer, a thermal transfer printer, a laser printer, and the like. In addition, the invention may be applied to an electronic apparatus other than the printer. For example, the invention may also be applied to a scanner apparatus having a transport device.

The technical spirit understood from the embodiment and the modifications will be described below.

(1) In the pulse signal generating device described above, the detection unit detects pulse missing abnormalities as one of the period abnormalities. According to this configuration, pulse missing of a pulse signal generated by the pulse generating unit can be prevented by performing switching to other pulse output signals, in which pulse abnormalities are not detected, when pulse missing abnormalities are detected by the detection unit.

(2) In the pulse signal generating device described above, the switching unit performs switching to a pulse output signal on the other encoder side, in which period abnormalities are not detected, when the period abnormalities are detected in the encoder on the pulse output signal side that is used for generation of the pulse signal.

What is claimed is:

1. A pulse signal generating device that generates a pulse signal on the basis of one switched pulse output signal of a plurality of pulse output signals output from a plurality of encoders, comprising:

the plurality of encoders each of which outputs an encoder signal with a pulse period corresponding to the speed of an object to be detected;

delay amount control unit that controls a relative delay amount with respect to a pulse signal for each of the plurality of pulse output signals output from the plurality of encoders;

a detection unit that individually detects abnormalities in pulses of the plurality of encoder signals;

a switching unit that performs switching to one pulse output signal, in which pulse abnormalities are not detected, of the plurality of pulse output signals; and a pulse generating unit that generates a pulse signal by delaying the one pulse output signal switched by the switching unit by the corresponding relative delay amount.

2. The pulse signal generating device according to claim 1, further comprising:

an output signal generating unit that generates the pulse output signal by making an adjustment such that a pulse period falls within a limit range on the basis of the encoder signal.

3. The pulse signal generating device according to claim 2, wherein the detection unit is configured to detect at least period upper limit abnormalities, in which a period exceeds an upper limit of a normal period, as the pulse abnormalities, and the output signal generating unit generates the pulse output signal based on an encoder pulse with the normal period by delaying an encoder pulse with a normal period, in which a pulse period falls within the limit range, among the encoder signals by a predetermined delay time allowing a pulse period between a pulse of a pulse output signal after switching and a pulse of a pulse output signal before switching to fall within the limit range when the switching unit switches the pulse output signal on the basis of detection of period upper limit abnormalities of the detection unit.

4. The pulse signal generating device according to claim 1, further comprising:

a reasonable period acquisition unit that measures a pulse period of the pulse signal and calculates a reasonable period on the basis of a plurality of period measurement results, wherein the pulse generating unit generates a pulse signal such that a pulse with the same period as the reasonable period is connected to one-previous pulse of the pulse signal when the detection unit detects the period abnormalities in all of the plurality of encoders.

5. The pulse signal generating device according to claim 1, wherein the delay amount control unit includes phase difference measuring units, which measure a phase difference, provided for every pulse output signals, and the relative delay amount is an adjustment time corresponding to the phase difference.

6. The pulse signal generating device according to claim 5, wherein the phase difference measuring unit corresponding to one pulse output signal switched by the switching unit stops measurement of a phase difference and holds a phase difference at the time of switching, and the phase difference measuring units corresponding to the other pulse output signals perform measurement of a phase difference, and the pulse generating unit delays the switched pulse output signal by an adjustment time corresponding to the held phase difference.

7. A transport device comprising:
the pulse signal generating device according to claim 1; and
a transport unit as the object to be detected,
wherein the encoder included in the pulse signal generating device outputs an encoder signal with a pulse period corresponding to the transport speed of the transport unit.

8. An image forming apparatus comprising:
the transport device according to claim 7;
a recording unit that performs recording to form an image on a target transported by the transport unit; and
a control unit that controls recording timing of the recording unit on the basis of the pulse signal generated by the pulse generating unit.

9. A pulse signal generating method of generating a pulse signal on the basis of one switched pulse output signal of a plurality of pulse output signals output from a plurality of encoders, comprising:

controlling a relative delay amount with respect to a pulse signal for each of the plurality of pulse output signals output from the plurality of encoders;

individually detecting abnormalities in pulses of the plurality of encoder signals;

performing switching to one pulse output signal, in which pulse abnormalities are not detected, of the plurality of pulse output signals; and generating a pulse signal by delaying the one pulse output signal switched in the switching by the corresponding relative delay amount.

* * * * *